US012581971B2

(12) United States Patent
Peng et al.

(10) Patent No.: US 12,581,971 B2
(45) Date of Patent: Mar. 17, 2026

(54) SEMICONDUCTOR DEVICE WITH BRIDGE DIE ELECTRICALLY CONNECTING TWO CHIPS AND MANUFACTURING METHOD THEREOF

(71) Applicant: MEDIATEK Inc., Hsinchu (TW)

(72) Inventors: Tai-Hao Peng, Hsinchu (TW); Yao-Tsung Huang, Hsinchu (TW)

(73) Assignee: MEDIATEK INC., Hsinchu City (TW)

( * ) Notice: Subject to any disclaimer, the term of this patent is extended or adjusted under 35 U.S.C. 154(b) by 422 days.

(21) Appl. No.: 18/191,092

(22) Filed: Mar. 28, 2023

(65) Prior Publication Data

US 2023/0387025 A1     Nov. 30, 2023

Related U.S. Application Data

(60) Provisional application No. 63/345,058, filed on May 24, 2022.

(51) Int. Cl.
H01L 23/538 (2006.01)
H01L 21/56 (2006.01)
H01L 23/31 (2006.01)

(52) U.S. Cl.
CPC .......... H01L 23/5381 (2013.01); H01L 21/56 (2013.01); H01L 23/3135 (2013.01); H01L 23/5384 (2013.01); H01L 23/5386 (2013.01)

(58) Field of Classification Search
CPC ............. H01L 23/5381; H01L 23/5384; H01L 21/56; H01L 23/49816; H01L 24/19

USPC ......................................................... 257/734
See application file for complete search history.

(56) References Cited

U.S. PATENT DOCUMENTS

| | | |
|---|---|---|
| 2013/0292846 A1 | 11/2013 | Lee |
| 2018/0358298 A1 | 12/2018 | Zhai |
| 2019/0131273 A1 * | 5/2019 | Chen .................... H01L 21/6835 |
| 2020/0227385 A1 | 7/2020 | Hiner |
| 2021/0005542 A1 | 1/2021 | Mallik |
| 2021/0074645 A1 | 3/2021 | Tsai |
| 2021/0134724 A1 | 5/2021 | Rubin |
| 2021/0335712 A1 | 10/2021 | Jain |
| 2022/0310577 A1 * | 9/2022 | Lee .................... H01L 23/5389 |
| 2023/0050400 A1 | 2/2023 | Kuo |

OTHER PUBLICATIONS

EP Search Report dated Nov. 16, 2023 in application No. 23170173. 1-1212/4283671.
TW Office Action dated Dec. 7, 2023 in Taiwan application No. 112118916.
EP Office Action dated Mar. 1, 2024 in EP application No. 23170173. 1-1212/4283671.

* cited by examiner

*Primary Examiner* — Quoc D Hoang
(74) *Attorney, Agent, or Firm* — McClure, Qualey & Rodack, LLP

(57)     ABSTRACT
A semiconductor device includes a first layer structure, a second layer structure, a bridge die, a first SoC and a second SoC. The bridge die is disposed between the first layer structure and the second layer structure. The first SoC and the second SoC are disposed on the second layer structure. The first SoC and the second SoC are electrically connected through the bridge die.

20 Claims, 24 Drawing Sheets

SEMICONDUCTOR DEVICE WITH BRIDGE DIE ELECTRICALLY CONNECTING TWO CHIPS AND MANUFACTURING METHOD THEREOF

This application claims the benefit of U.S. Provisional application Ser. No. 63/345,058, filed May 24, 2022, the disclosure of which is incorporated by reference herein in its entirety.

FIELD OF THE INVENTION

The invention relates to a semiconductor device and a manufacturing method thereof, and more particularly to a semiconductor device and a manufacturing method thereof including a bridge die.

BACKGROUND OF THE INVENTION

A semiconductor device may include a number of substrates and a number of chips, wherein the chips are disposed on different substrates respectively. Thus, how to make the chips communicate with each other has become a prominent task for the industries.

SUMMARY OF THE INVENTION

In an embodiment of the invention, a semiconductor device is provided. The semiconductor device includes a first layer structure, a second layer structure, a bridge die, a first SoC and a second SoC. The bridge die is disposed between the first layer structure and the second layer structure. The first SoC and the second SoC are disposed on the second layer structure. The first SoC and the second SoC are electrically connected through the bridge die.

In another embodiment of the invention, a manufacturing method of a semiconductor device is provided. The manufacturing method includes the following steps: forming a first one of a first layer structure and a second layer structure on a first carrier; disposing a bridge die on the first one; forming a second one of a first layer structure and a second layer structure on the bridge die, wherein the bridge die is disposed between the first layer structure and the second layer structure; and disposing a first SoC and a second SoC on the second layer structure, wherein the first SoC and the second SoC are electrically connected through the bridge die.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which.

DETAILED DESCRIPTION OF PREFERRED EMBODIMENTS

Figure 1A:
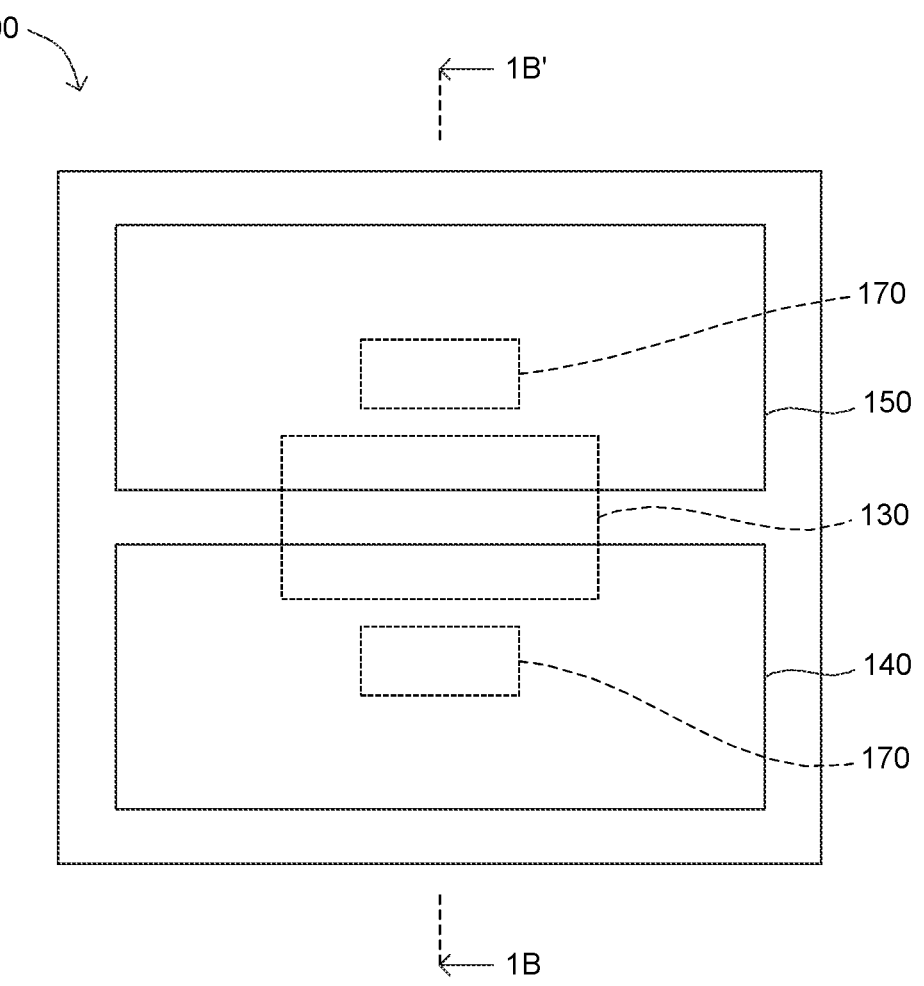
FIG. 1A illustrates a diagram view of a top view of a semiconductor device according to an embodiment of the invention.
Figure 1B:
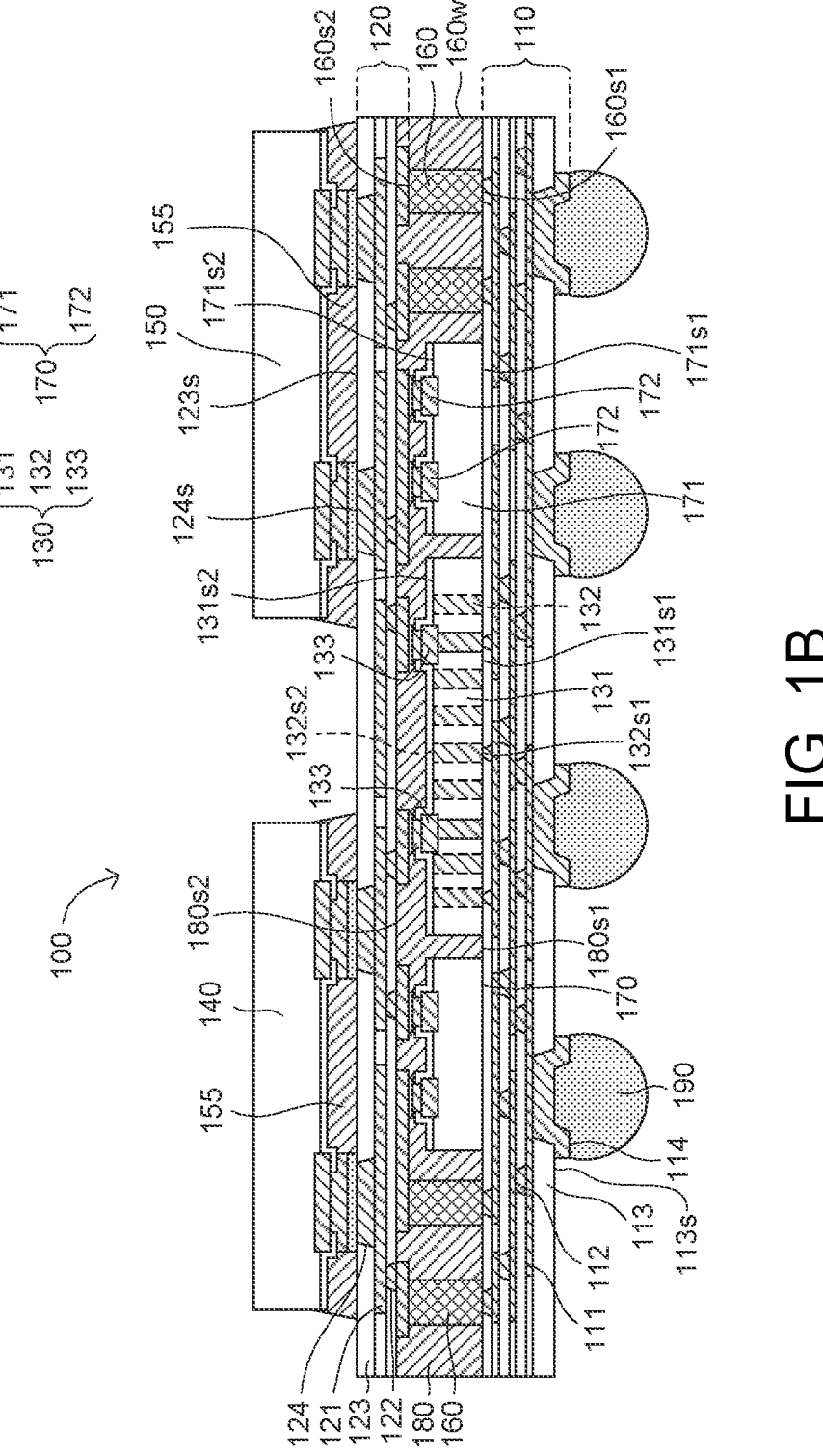
FIG. 1B illustrates a diagram view of a cross-sectional view of the semiconductor device of FIG. 1A in a direction 1B-16'.

Referring to FIGS. 1A and 1B, FIG. 1A illustrates a diagram view of a top view of a semiconductor device 100 according to an embodiment of the invention, and FIG. 1B illustrates a diagram view of a cross-sectional view of the semiconductor device 100 of FIG. 1A in a direction 1B-1B'. The semiconductor device 100 may be applied to a high bandwidth package on package (HBPoP), a Fan-out package on package (Fan-out PoP), etc.

As illustrated in FIG. 1B, the semiconductor device 100 includes a first layer structure 110, a second layer structure 120, at least one bridge die 130, at least one first System on a Chip (SoC) 140, at least one second SoC 150, at least one under-filler 155, at least one conductive pillar 160, at least one passive component 170, a first encapsulation body 180 and at least one conductive contact 190. The bridge die 130 is disposed between the first layer structure 110 and the second layer structure 120. The first SoC 140 and the second SoC 150 are disposed on the second layer structure 120. In the present embodiment, the first SoC 140 and the second SoC 150 are electrically connected to each other through the bridge die 130.

As illustrated in FIG. 1B, the first layer structure 110 is, for example, re-distributed layer (RDL) structure including a fan-out structure. For example, the first layer structure 110 includes at least one first conductive trace layer 111, at least one first conductive via layer 112, at least one first dielectric layer 113 and at least one first conductive contact 114, wherein the adjacent two conductive trace layers 111 are separated from one of the first dielectric layers 113, and the adjacent two first conductive trace layers 111 is electrically connected by one of the first conductive via layers 112. The first conductive contact 114 is electrically to the first conductive trace layer 111 or the first conductive via layer 112 of the first layer structure 110, and protrudes with respect to a surface 113s of the outermost first dielectric layers 113. In addition, the first conductive contact 114 is, for example, a conductive bump, a conductive pad, etc.

The first conductive trace layer 111, the first conductive via layer 112 and the first conductive contact 114 may be formed of, a material including, for example, copper, etc., and the first dielectric layers 113 may be formed of, a material including, for example, polyimide (PI), etc. In an embodiment, the conductive trace layer 111 has a thickness ranging 4 micrometers (μm) to 8 μm, for example, 4 μm, 5 μm, 6 μm, 7 μm, 8 μm etc., even greater, or smaller.

As illustrated in FIG. 1B, the second layer structure 120 is, for example, a RDL structure including a fan-out structure. For example, the second layer structure 120 includes at least one second conductive trace layer 121, at least one second conductive via layer 122, at least one second dielectric layer 123 and at least one second conductive contact 124, wherein the adjacent two second conductive trace layers 121 are separated from one of the second dielectric layers 123, and the adjacent two second conductive trace layers 121 is electrically connected by one of the second conductive via layers 122. The second conductive contact 124 has a surface 124s, and the outermost second dielectric layer 123 has a surface 123s, wherein the surface 124s and the terminal surface 123s are flush with each other.

In addition, the second conductive trace layer 121, the second conductive via layer 122 and the second conductive contact 124 may be formed of, a material including, for example, copper, etc., and the second dielectric layers 123 may be formed of, a material including, for example, polyimide, etc. In an embodiment, the second conductive trace layer 121 has a thickness ranging 4 μm to 8 μm, for example, 4 μm, 5 μm, 6 μm, 7 μm, 8 μm etc., even greater, or smaller.

As illustrated in FIG. 1B, the bridge die 130 electrically connects the first SoC 140 with the second SoC 150 through the first layer structure 110. For example, the bridge die 130 includes a silicon-based substrate 131, a plurality of conductive via 132 and a plurality of conductive contacts 133. The silicon-based substrate 131 has a first surface 131s1 and a second surface 131s2 opposite to the first surface 131s1. The conductive via 132 is, for example, a through-silicon via (TSV). The conductive via 132 has a first surface 132s1 and a second surface 132s2 opposite to the first surface 132s1, wherein the first surface 132s1 and the second surface 132s2 are exposed from the first surface 131s1 and second surface 131s2 respectively. The first surface 131s1 of the silicon-based substrate and the first surface 132s1 of the conductive via 132 are flush with each other.

As illustrated in FIG. 1B, the conductive via 132 electrically connects the first SoC 140 with the second SoC 150 through the second layer structure 120. For example, each conductive contact 133 is electrically connected to a corresponding conductive via 132, and the conductive via 132 is electrically connected to the second layer structure 120 through the corresponding conductive contact 133. In addition, the conductive via 132 is electrically connected to the first layer structure 110. In addition, the conductive contacts 133 are formed at the same side adjacent to the second surface 131s2. The conductive contact 133 is, for example, a solder ball, a conductive bump, a conductive pad, etc.

Due to the bridge die 130 being a silicon-based die, the bridge die 130 may provide a high-density I/O contacts (for example, a large number of the conductive vias 132 and/or a large number of the conductive contacts 133) to support the sum of the number of the I/O contacts of the first SoC 140 and the number of the I/O contacts of the second SoC 150.

The SoC is an integrated circuit that integrates most or all components of a computer or other electronic system. These components may include a central processing unit (CPU), memory interfaces, on-chip input/output devices, input/output interfaces, and secondary storage interfaces, often alongside other components such as radio modems and a graphics processing unit (GPU)—all on a single substrate or microchip. The SoC may contain digital, analog, mixed-signal, and often radio frequency signal processing functions (otherwise it is considered only an application processor).

The under-filler 155 is formed between the first SoC 140 and the second layer structure 120 to encapsulate the contacts between the first SoC 140 and the second layer structure 120, and another under-filler 155 is formed between the second SoC 150 and the second layer structure 120 to encapsulate the contacts between the second SoC 150 and the second layer structure 120.

As illustrated in FIG. 1B, in an embodiment, the first SoC 140 and the second SoC are not directly connected to each other, but indirectly connected to each other though the bridge die 130 and the second layer structure 120.

As illustrated in FIG. 1B, the conductive pillars 160 connect the first layer structure 110 with the second layer structure 120. For example, the conductive pillar 160 has a first surface 160s1 and a second surface 160s2 opposite to the first surface 160s1. The first surface 160s1 is electrically connected to the first conductive trace layer 111 or the first conductive via layer 112 of the first layer structure 110. The second surface 160s2 is electrically connected to the second conductive trace layer 121 or the second conductive via layer 122 of the second layer structure 120. The first surface 160s1 and the first surface 131s1 of the silicon-based substrate 131 are flush with each other.

As illustrated in FIG. 1B, the conductive pillar 160 further has a lateral surface 160w covered by the first encapsulation body 180, while the first surface 160s1 and the second surface 160s2 are not covered by the first encapsulation body 180.

As illustrated in FIG. 1B, the passive component 170 is, for example, an Integrated Passive Device (IPD) disposed between the first layer structure 110 and the second layer structure 120. The passive component 170 and the bridge die 130 are disposed side by side. The passive component 170 is, for example, a resistor, a capacitor or an inductor. The passive component 170 includes a substrate 171 and a plurality of conductive contacts 172. The substrate 171 is, for example, a silicon-based substrate. The substrate 171 has a first surface 171s1 and a second surface 171s2 opposite to the first surface 171s1. The conductive contacts 172 are formed on a side adjacent to the second surface 171s2 of the substrate 171. The conductive contacts 172 may be electrically connected to the second layer structure 120. For example, the conductive contacts 172 may be electrically connected to the second conductive trace layer 121 or the second conductive via layer 122 of the second layer structure 120. In addition, conductive contact 172 is, for example, a solder ball, a conductive bump, a conductive pad, etc.

As illustrated in FIG. 1B, in comparison with the passive component 170 disposed below the first layer structure 110, the passive component 170 of the present embodiment and the SoC are separated by merely one layer structure (for example, the second layer structure 120), and such a shorter distance may improve voltage stabilization effect (voltage drop is reduced). In addition, due to the passive component 170 being integrated into (disposed within) the first encapsulation body 180, the SoC is allowed to have a larger thickness (for example, about 700 micrometers) and accordingly it may increase the heat dissipation of a component, such as a SoC and/or a memory die disposed on the second layer structure 120.

As illustrated in FIG. 1B, the first encapsulation body 180 encapsulates at least one bridge die 130, at least one conductive pillar 160 and at least one passive component 170. The first encapsulation body 180 is, for example, molding compound. The molding compound may be formed of a molding material including, for example, a Novolac-based resin, an epoxy-based resin, a silicone-based resin, or another suitable encapsulant. Suitable fillers also may be included, such as powdered SiO2. The molding material may be applied using any of a number of molding techniques, such as compression molding, injection molding, or transfer molding.

As illustrated in FIG. 1B, the first encapsulation body 180 has a first surface 180$s1$, wherein the first surface 180$s1$, the first surface 171$s1$, the first surface 160$s1$, the first surface 131$s1$ and the first surface 132$s1$ are flush with each other.

As described above, the semiconductor device 100 has a coplanar surface including at least two of a portion of the first encapsulation body 180, a portion of the passive component 170, a portion of the conductive pillar 160 and a portion of the bridge die 130.

As illustrated in FIG. 1B, the conductive contact 190 is formed on and electrically connected to the first layer structure 110. For example, the conductive contact 190 is formed on and electrically connected to the first conductive contact 114 of the first layer structure 110. In addition, the conductive contact 190 may be a solder ball, a pre-solder, a metal bump, a metal pillar, etc.

Figure 2:
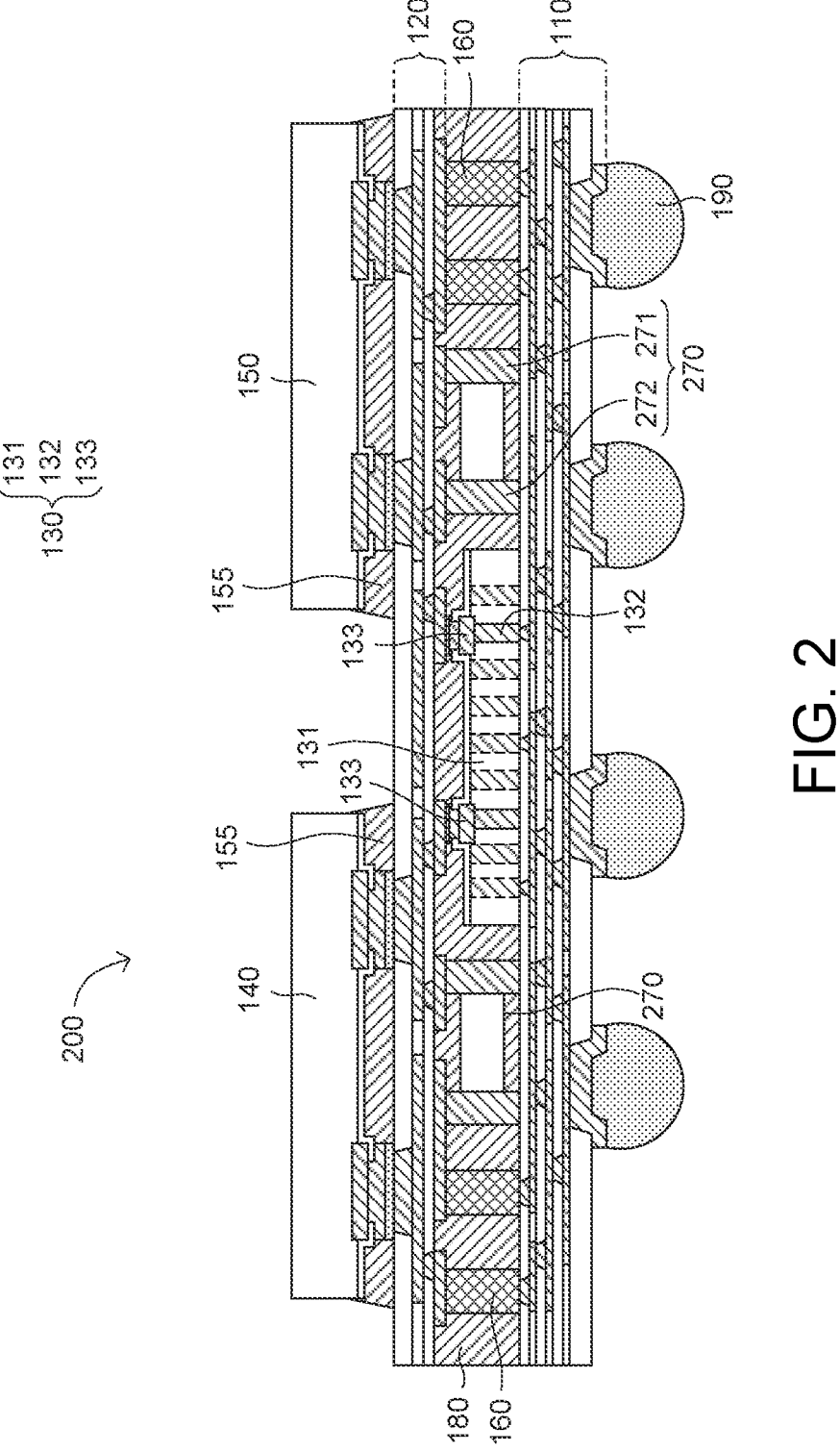
FIG. 2 illustrates a diagram view of a cross-sectional view of a semiconductor device 200 according to another embodiment of the invention.

Referring to FIG. 2, FIG. 2 illustrates a diagram view of a cross-sectional view of a semiconductor device 200 according to another embodiment of the invention. The semiconductor device 200 may applied to a HBPoP, an InFO PoP, etc.

As illustrated in FIG. 2, the semiconductor device 200 includes the first layer structure 110, the second layer structure 120, at least one bridge die 130, at least one first SoC 140, at least one second SoC 150, at least one under-filler 155, at least one conductive pillar 160, at least one passive component 270, the first encapsulation body 180 and at least one conductive contact 190. The bridge die 130 is disposed between the first layer structure 110 and the second layer structure 120. The first SoC 140 and the second SoC 150 are disposed on the second layer structure 120. The first SoC 140 and the second SoC 150 are electrically connected through the bridge die 130.

The semiconductor device 200 includes the features the same as or similar to that of the semiconductor device 100 except that, for example, the passive component 270 is different from the passive component 170.

In the present embodiment, the passive component 270 is, for example, a Ceramic passive component such as a Multi-layer Ceramic Capacitor (MLCC). The passive component 270 includes a first electrode 271 and a second electrode 272, wherein the first electrode 271 and the second electrode 272 are located at opposite two sides of the passive component 270. Each of the first electrode 271 and the second electrode 272 has two opposite terminal surfaces electrically connected to the first layer structure 110 and the second layer structure 120 respectively.

Figure 3:
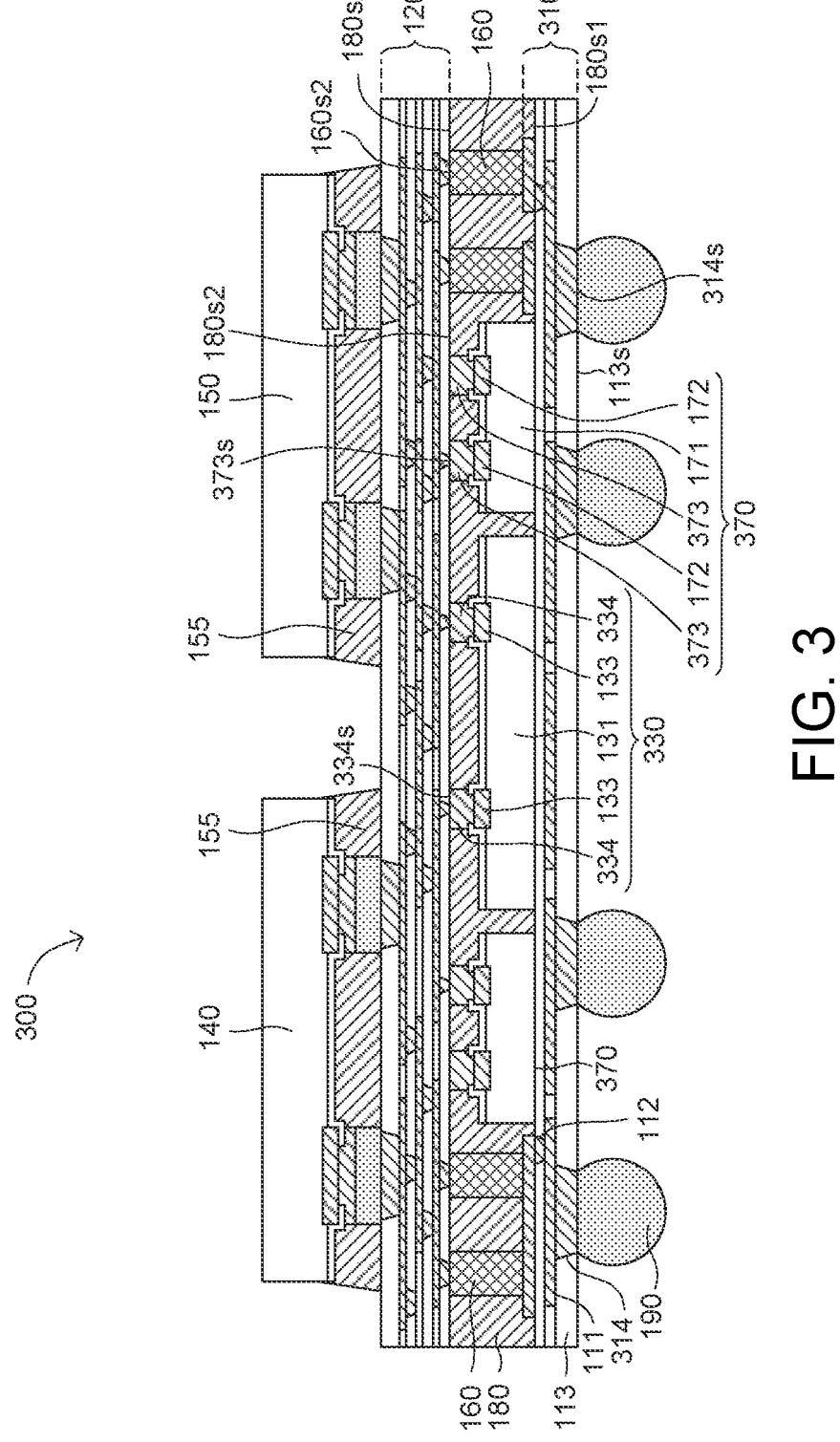
FIG. 3 illustrates a diagram view of a cross-sectional view of a semiconductor device according to another embodiment of the invention.

Referring to FIG. 3, FIG. 3 illustrates a diagram view of a cross-sectional view of a semiconductor device 300 according to another embodiment of the invention. The semiconductor device 300 may applied to a HBPoP, an InFO PoP, etc.

As illustrated in FIG. 3, the semiconductor device 300 includes a first layer structure 310, the second layer structure 120, at least one bridge die 330, at least one first SoC 140, at least one second SoC 150, at least one under-filler 155, at least one conductive pillar 160, at least one passive component 370, the first encapsulation body 180 and at least one conductive contact 190. The bridge die 330 is disposed between the first layer structure 310 and the second layer structure 120. The first SoC 140 and the second SoC 150 are disposed on the second layer structure 120. The first SoC 140 and the second SoC 150 are electrically connected through the bridge die 330.

As illustrated in FIG. 3, the semiconductor device 300 includes the features the same as or similar to that of the semiconductor device 100 except that, for example, the bridge die 330 of the semiconductor device 300 is different from the bridge die 130 of the semiconductor device 100. In comparison with the bridge die 130, the bridge die 330 may omit the conductive vias 132. The bridge die 330 may be electrically connected to the first layer structure 310 through the second layer structure 120 and the conductive pillar 160.

In addition, the passive component 370 includes the substrate 171, at least one conductive contact 172 and at least one conductive contact 373, wherein the conductive contacts 373 is electrically connected to the conductive contact 172 and protrudes with respect to the conductive contact 172. The conductive contact 373 has a surface 373$s$. The bridge die 330 further includes at least one conductive contact 334, wherein the conductive contact 334 is formed on and electrically connected to the conductive contact 133, and protrudes with respect to the conductive contact 133. The conductive contact 334 has a surface 334$s$. The first encapsulation body 180 further has a second surface 180$s2$ opposite to the first surface 180$s1$. The surface 373$s$ of the passive component 370, the surface 334$s$ of the bridge die 330, the second surface 160$s2$ of the conductive pillar 160 and the second surface 180$s2$ of the first encapsulation body 180 are flush with each other.

As described above, the semiconductor device 300 has a coplanar surface including at least two of a portion of the first encapsulation body 180, a portion of the passive component 370, a portion of the conductive pillar 160 and a portion of the bridge die 330.

As illustrated in FIG. 3, the first layer structure 310 includes at least one first conductive trace layer 111, at least one first conductive via layer 112, at least one first dielectric layer 113 and at least one first conductive contact 314. The first conductive contact 314 has a surface 314$s$, and the outermost first dielectric layer 113 has the surface 113$s$, wherein the surface 314$s$ and the surface 113$s$ are flush with each other. In addition, the first conductive contact 314 is, for example, a conductive bump, a conductive pad, etc.

Figure 4:
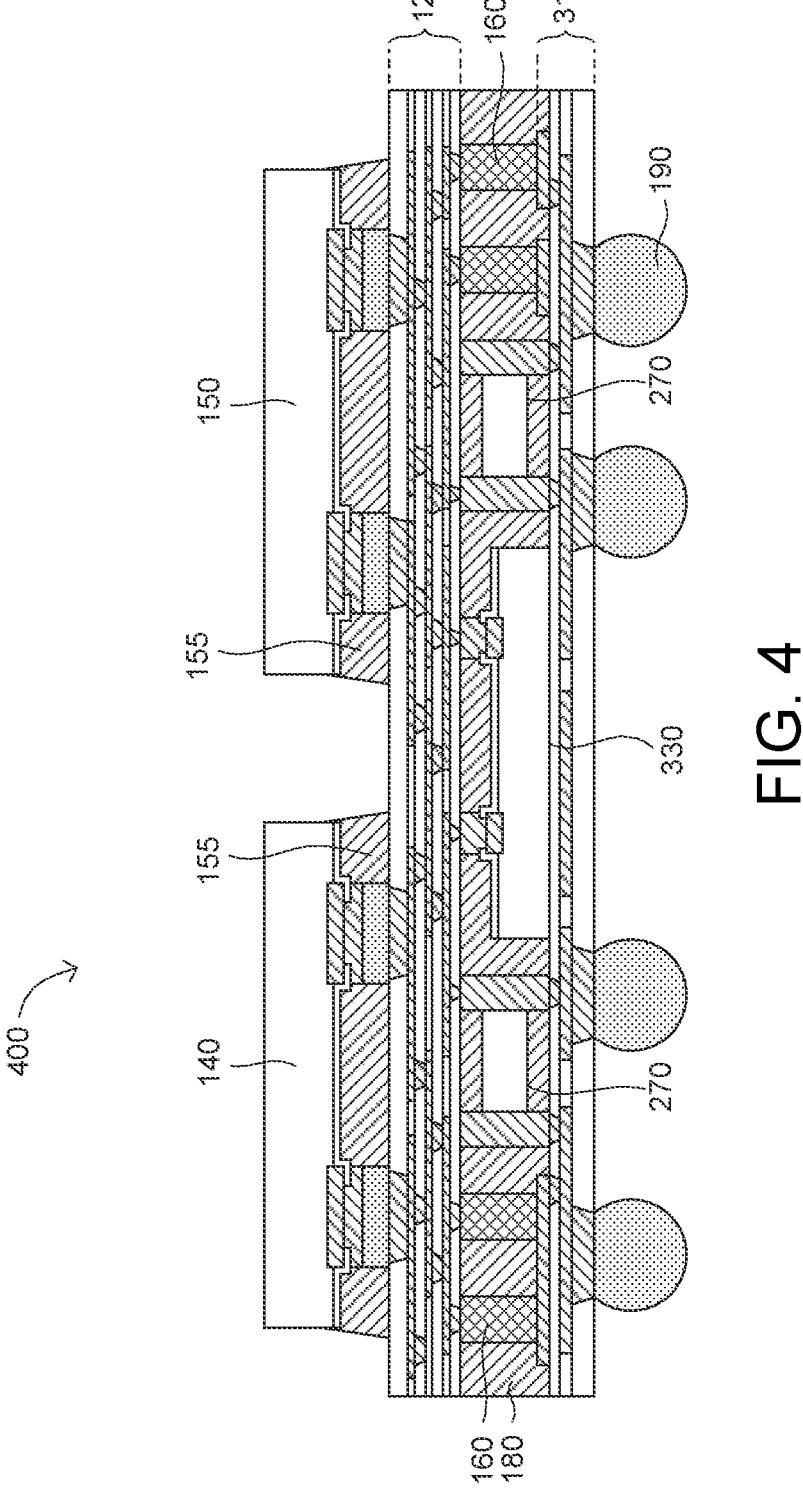
FIG. 4 illustrates a diagram view of a cross-sectional view of a semiconductor device according to another embodiment of the invention.

Referring to FIG. 4, FIG. 4 illustrates a diagram view of a cross-sectional view of a semiconductor device 400 according to another embodiment of the invention. The semiconductor device 400 may applied to a HBPoP, InFO PoP, etc.

As illustrated in FIG. 4, the semiconductor device 400 includes the first layer structure 310, the second layer structure 120, at least one bridge die 330, at least one first SoC 140, at least one second SoC 150, at least one under-filler 155, at least one conductive pillar 160, at least one passive component 270, the first encapsulation body 180 and at least one conductive contact 190. The bridge die 330 is disposed between the first layer structure 310 and the second layer structure 120. The first SoC 140 and the second SoC

150 are disposed on the second layer structure 120. The first SoC 140 and the second SoC 150 are electrically connected through the bridge die 330.

The semiconductor device 400 includes the features the same as or similar to that of the semiconductor device 300 except that, for example, the passive component 170 of the semiconductor device 300 may be replaced by the passive component 270 of the semiconductor device 400.

Figure 5:
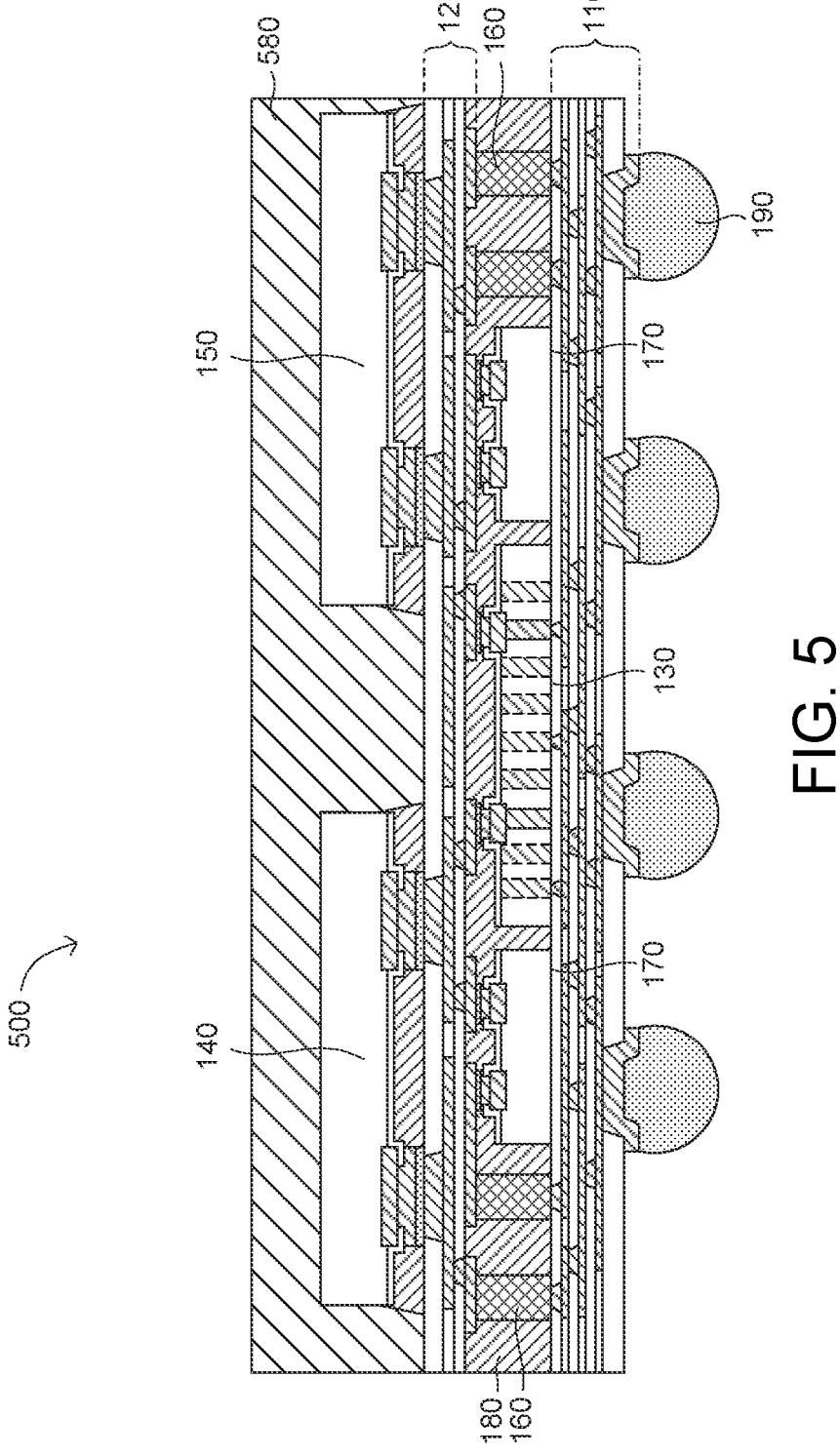
FIG. 5 illustrates a diagram view of a cross-sectional view of a semiconductor device according to another embodiment of the invention.

Referring to FIG. 5, FIG. 5 illustrates a diagram view of a cross-sectional view of a semiconductor device 500 according to another embodiment of the invention. The semiconductor device 500 may applied to a HBPoP, InFO PoP, etc.

As illustrated in FIG. 5, the semiconductor device 500 includes the first layer structure 110, the second layer structure 120, at least one bridge die 130, at least one first SoC 140 and at least one second SoC 150, at least one conductive pillar 160, at least one passive component 170, the first encapsulation body 180, at least one conductive contact 190 and a second encapsulation body 580.

The semiconductor device 500 includes the features the same as or similar to that of the semiconductor device 100 except that, for example, the semiconductor device 500 further include the second encapsulation body 580.

As illustrated in FIG. 5, the second encapsulation body 580 is formed on the second layer structure 120 and encapsulates the first SoC 140 and the second SoC 150 for protecting the first SoC 140 and the second SoC 150. The second encapsulation body 580 is, for example, molding compound. The molding compound may be formed of a molding material including, for example, a Novolac-based resin, an epoxy-based resin, a silicone-based resin, or another suitable encapsulant. Suitable fillers also may be included, such as powdered SiO2. The molding material may be applied using any of a number of molding techniques, such as compression molding, injection molding, or transfer molding.

In another embodiment, the semiconductor device 200 may further the second encapsulation body 580 encapsulating the first SoC 140 and the second SoC 150 for protecting the first SoC 140 and the second SoC 150.

Figure 6:
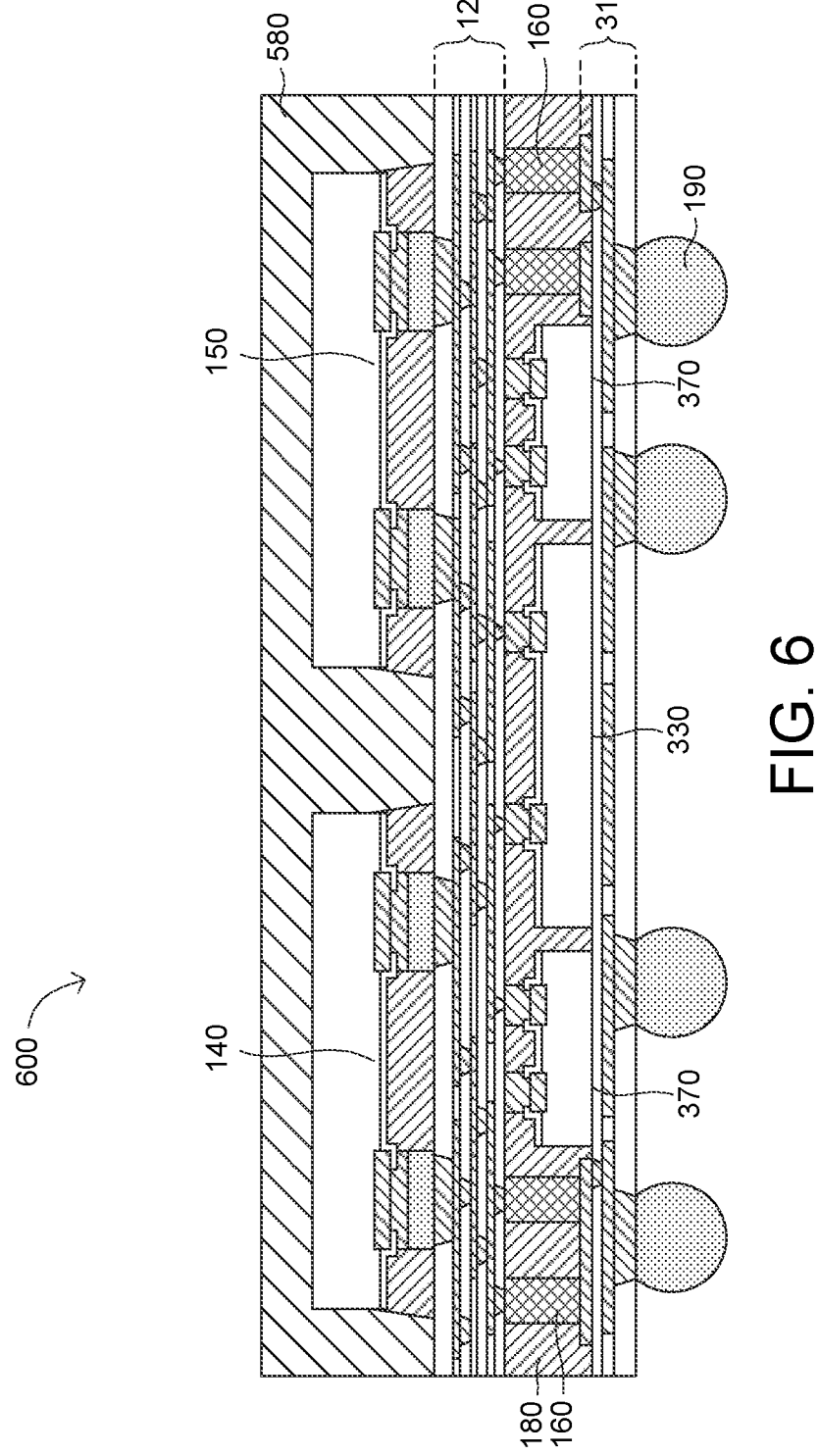
FIG. 6 illustrates a diagram view of a cross-sectional view of a semiconductor device according to another embodiment of the invention.

Referring to FIG. 6, FIG. 6 illustrates a diagram view of a cross-sectional view of a semiconductor device 600 according to another embodiment of the invention. The semiconductor device 600 may applied to a HBPoP, InFO PoP, etc.

As illustrated in FIG. 6, the semiconductor device 600 includes the first layer structure 310, the second layer structure 120, at least one bridge die 330, at least one first SoC 140 and at least one second SoC 150, at least one conductive pillar 160, at least one passive component 370, the first encapsulation body 180, at least one conductive contact 190 and the second encapsulation body 580.

The semiconductor device 600 includes the features the same as or similar to that of the semiconductor device 300 except that, for example, the semiconductor device 600 further include the second encapsulation body 580 encapsulating the first SoC 140 and the second SoC 150 for protecting the first SoC 140 and the second SoC 150.

In another embodiment, the semiconductor device 400 may further the second encapsulation body 580 encapsulating the first SoC 140 and the second SoC 150 for protecting the first SoC 140 and the second SoC 150.

Figure 7A:
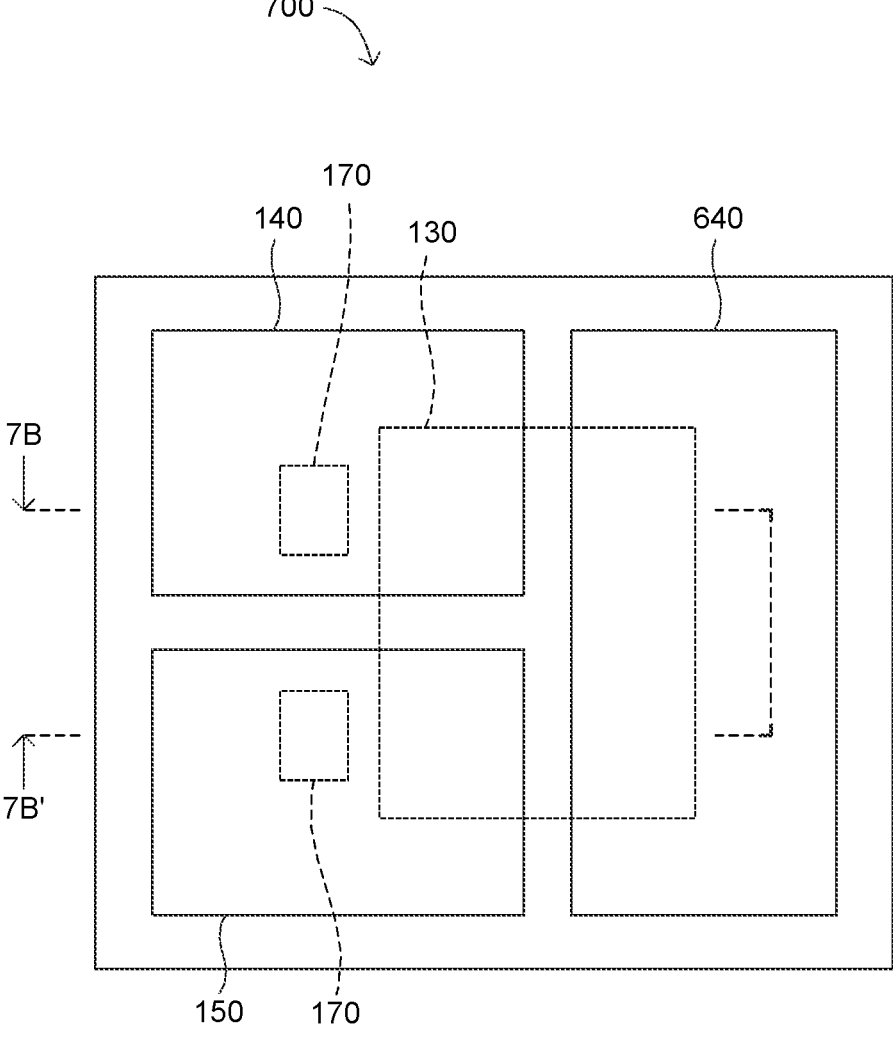
FIG. 7A illustrates a diagram view of a top view of a semiconductor device according to another embodiment of the invention.
Figure 7B:
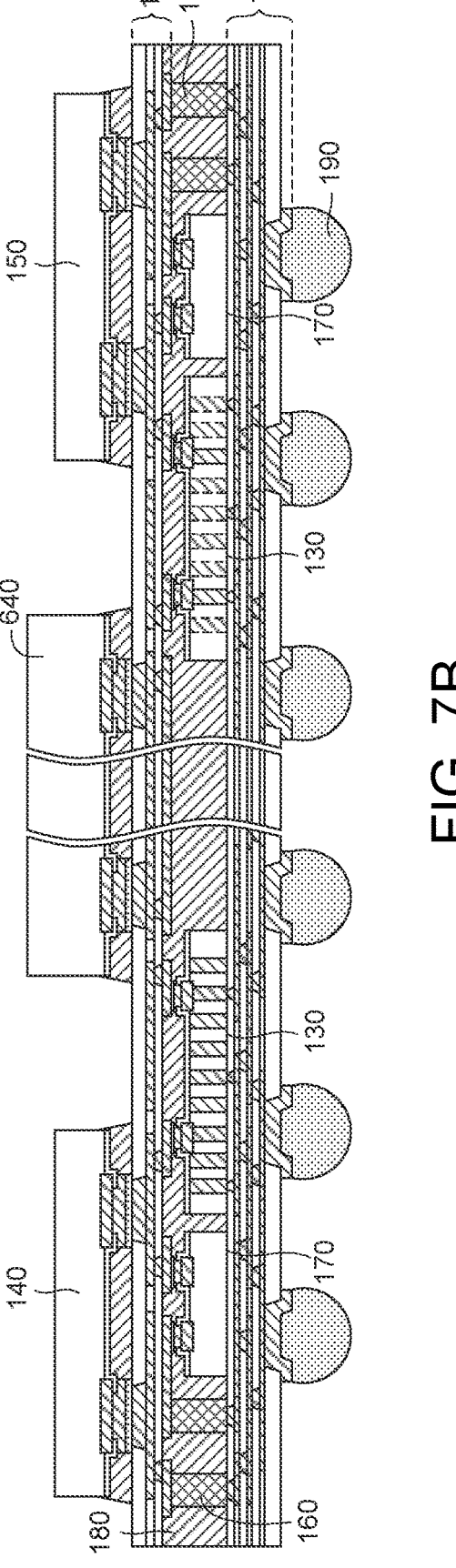
FIG. 7B illustrates a diagram view of a cross-sectional view of the semiconductor device of FIG. 7A in a direction 7B-7B'.

Referring to FIGS. 7A and 7B, FIG. 7A illustrates a diagram view of a top view of a semiconductor device 700 according to another embodiment of the invention, and FIG. 7B illustrates a diagram view of a cross-sectional view of the semiconductor device 700 of FIG. 7A in a direction 7B-7B'. The semiconductor device 700 may applied to a HB (High Bandwidth) PoP (Package on Package), Fan-out PoP, etc.

As illustrated in FIG. 7B, the semiconductor device 700 includes the first layer structure 110, the second layer structure 120, at least one bridge die 130, at least one first SoC 140 and at least one second SoC 150, at least one conductive pillar 160, at least one passive component 170, the first encapsulation body 180, at least one conductive contact 190 and at least one memory die 640.

As illustrated in FIG. 7B, the semiconductor device 700 includes the features the same as or similar to that of the semiconductor device 100 except that, for example, the semiconductor device 700 further include the memory die 640.

As illustrated in FIG. 7B, the memory die 640 is disposed on the second layer structure 120. The first SoC 140, the second SoC 150 and the memory die 640 are electrically connected to each other through the bridge die 640. In the present embodiment, the first SoC 140, the second SoC 150 and the memory die 640 are not directly connected, but indirectly connected through the second layer structure 120 and the bridge die 130. In addition, the memory die 640 is, for example, DRAM, etc.

In another embodiment, the semiconductor device 700 may further include the second encapsulation body 580 of FIG. 5 encapsulating the first SoC 140, the second SoC 150 and the memory die 640 for protecting the first SoC 140, the second SoC 150 and the memory die 640.

In other embodiments, the semiconductor device 200 may further include the memory die 640 disposed on the second layer structure 120, the semiconductor device 300 may further include the memory die 640 disposed on the second layer structure 120, and the semiconductor device 400 may further include the memory die 640 disposed on the second layer structure 120.

Referring to FIGS. 8A to 8I, FIGS. 8A to 8I illustrate schematic diagrams of a manufacturing method of the semiconductor device 100 of FIG. 1B.

Figure 8A:
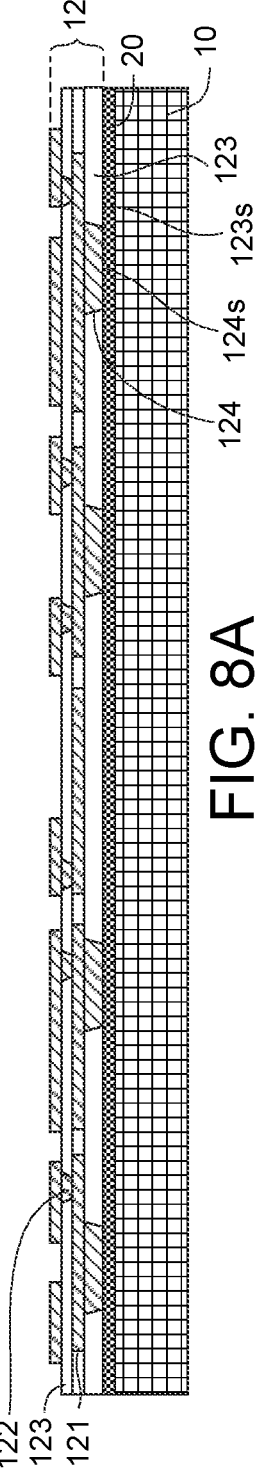
FIGS. 8A to 8I illustrate schematic diagrams of a manufacturing method of the semiconductor device of FIG. 1B.

As illustrated in FIG. 8A, the second layer structure 120 (the first one) is formed on a first carrier 10 through a first release layer 20, wherein the second layer structure 120 includes at least one second conductive trace layer 121, at least one second conductive via layer 122, at least one second dielectric layer 123 and at least second conductive contact 124, wherein the adjacent two second conductive trace layers 121 are separated from one of the second dielectric layers 123, and the adjacent two second conductive trace layers 121 may be electrically connected by one of the second conductive via layers 122. The second conductive contact 124 has the surface 124s, and the outermost second dielectric layer 123 has the surface 123s, wherein the surface 124s and the surface 123s are flush with each other. In addition, the second conductive trace layer 121, the second conductive via layers 122 and the second conductive contact 124 may be formed by using, for example, electroplating, etc., and the second dielectric layer 123 may be formed by using, for example, lithography, etc.

Figure 8B:
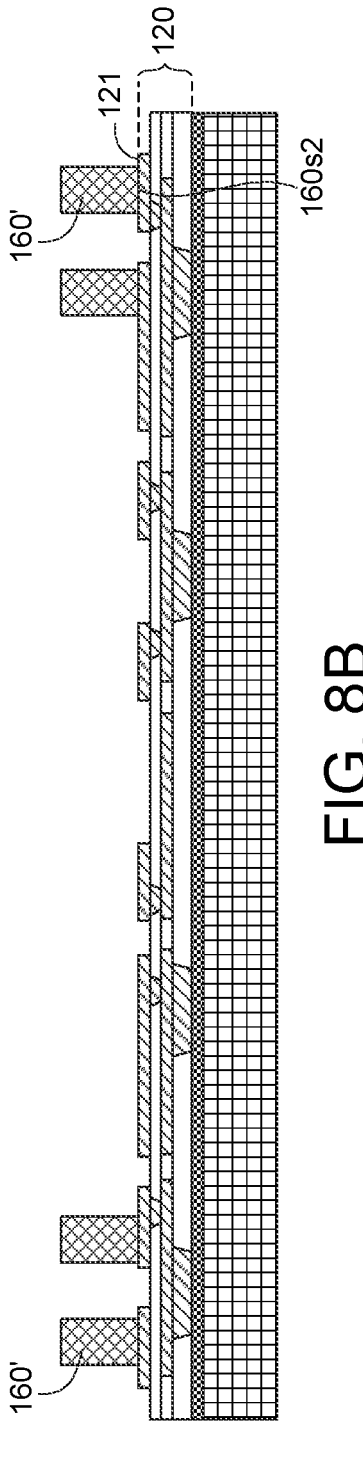

As illustrated in FIG. 8B, at least one conductive pillar 160' is formed on the second layer structure 120 by using, for example, electroplating, etc. Furthermore, the conductive pillar 160' has the second surface 160s2, and the second surface 160s2 is formed on and electrically connected to the second conductive trace layer 121 or the second conductive via layer 122 of the second layer structure 120.

Figures 8C, 8D:
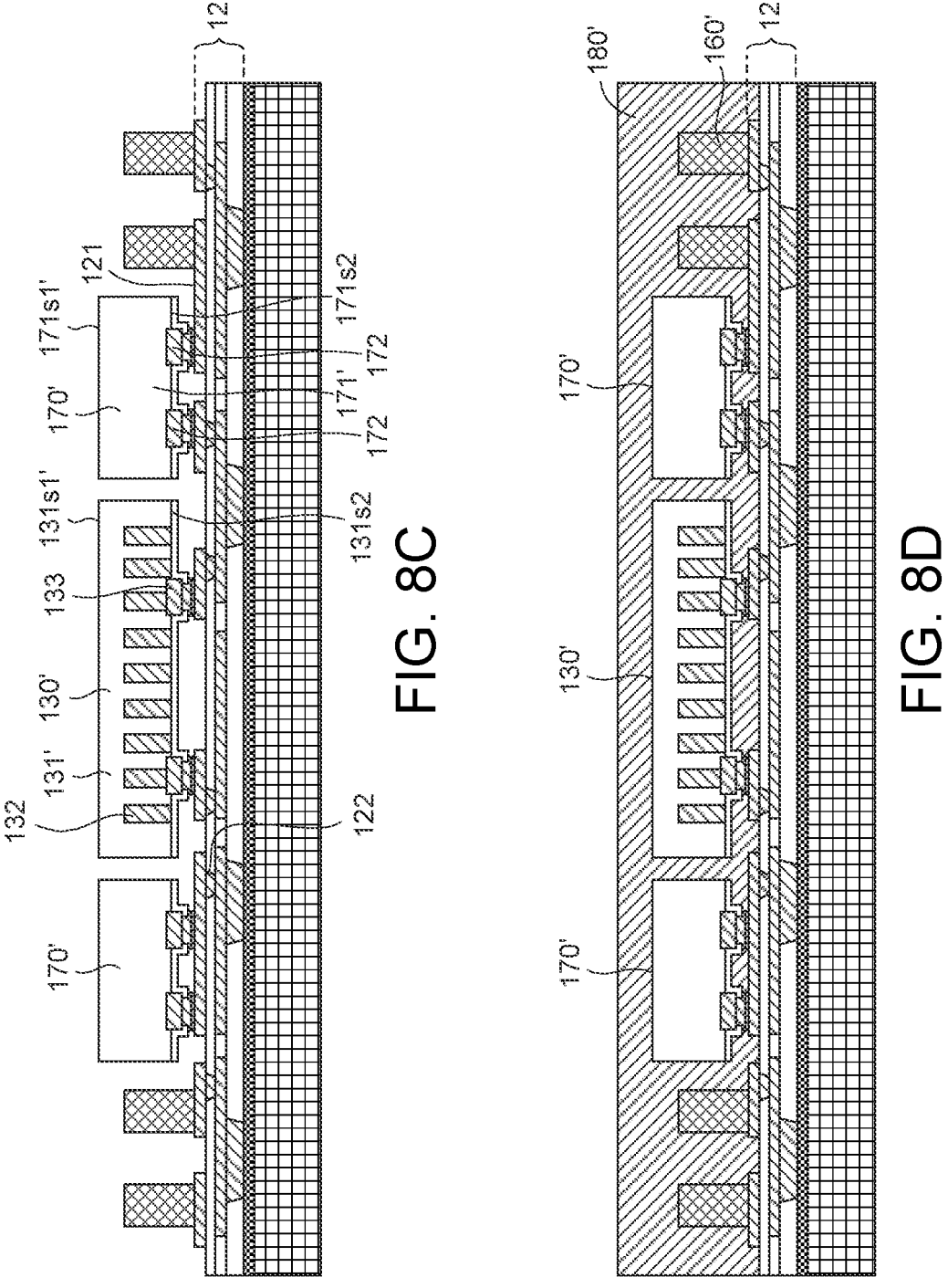

As illustrated in FIG. 8C, at least one bridge die 130' and at least one passive component 170' are disposed on the second layer structure 120 by using, for example, a SMT (Surface mount technology).

The bridge die 130' includes a silicon-based substrate 131', the plurality of the conductive vias 132 and a plurality of the conductive contacts 133. The silicon-based substrate 131' has the first surface 131s1' and the second surface 131s2 opposite to the first surface 131s1', wherein the conductive via 132 is exposed from the second surface 131s2, but not exposed from the first surface 131s1'. Each conductive contact 133 is electrically to the corresponding conductive via 132. The conductive via 132 may be electrically connected to the second layer structure 120 through the conductive contacts 133.

The passive component 170' includes a substrate 171' and a plurality of conductive contacts 172. The substrate 171' is, for example, a silicon-based substrate. The substrate 171' has a first surface 171s1' and the second surface 171s2 opposite to the first surface 171s1'. The conductive contacts 172 are formed on a side adjacent to the second surface 171s2 of the substrate 171. The conductive contacts 172 may be electrically connected to the second layer structure 120. For example, the conductive contacts 171 may be electrically connected to the second conductive trace layer 121 or the second conductive via layer 122 of the second layer structure 120. In addition, conductive contact 172 is, for example, a solder ball, a conductive bump, a conductive pad, etc.

As illustrated in FIG. 8D, a first encapsulation body material 180' encapsulating at least one bridge die 130', at least one passive component 170', at least one conductive pillar 160' is formed on the second layer structure 120 by using, for example, a compression molding, an injection molding or a transfer molding.

Figures 8E, 8F:
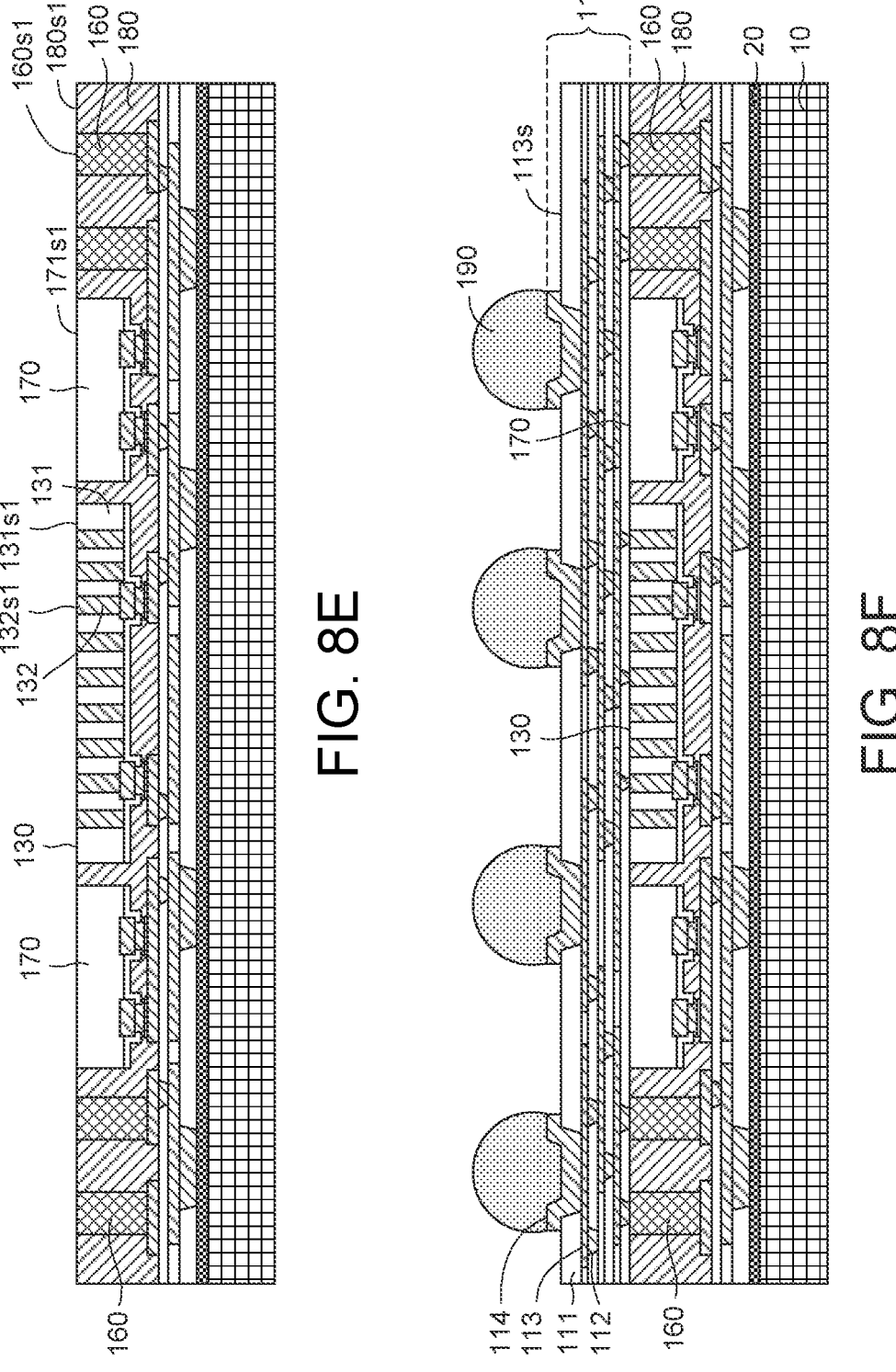

As illustrated in FIG. 8E, a portion of the first encapsulation body material 180', a portion of the bridge die 130', a portion of the passive component 170' and a portion of the conductive pillar 160' are removed to form the first encapsulation body 180, the bridge die 130, the passive component 170 and the conductive pillar 160 respectively by using, for example, a CMP (Chemical-Mechanical Planarization). After being removed, a coplanar surface including at least two of a portion of the first encapsulation body 180, a portion of the passive component 170, a portion of the conductive pillar 160 and a portion of the bridge die 130 is formed. For example, after being removed, the first encapsulation body 180 has the first surface 180s1, the bridge die 130 has the first surface 131s1, the conductive via 132 has the first surface 132s1, the passive component 170 has the first surface 171s1 and the conductive pillar 160 has the first surface 160s1, wherein the first surface 180s1, the first surface 131s1, the first surface 132s1, the first surface 171s1 and the first surface 160s1 are flush with each other.

As illustrated in FIG. 8F, the first layer structure 110 (the second one) is formed on at least one bridge die 130, at least one conductive pillar 160, at least one passive component 170 and the first encapsulation body 180. The first layer structure 110 includes at least one first conductive trace layer 111, at least one first conductive via layer 112, at least one first dielectric layer 113 and at least first conductive contact 114, wherein the adjacent two first conductive trace layers 111 are separated from one of the first dielectric layers 113, and the adjacent two first conductive trace layers 111 may be electrically connected by one of the first conductive via layers 112. The first conductive contact 114 is electrically to the first conductive trace layer 111 or the first conductive via layer 112 of the first layer structure 110, and protrudes with respect to a surface 113s of the outermost first dielectric layers 113. In addition, the first conductive trace layer 111, the first conductive via layers 112 and the first conductive contact 114 may be formed by using, for example, electroplating, etc., and the first dielectric layer 113 may be formed by using, for example, lithography, etc.

As illustrated in FIG. 8F, at least one conductive contact 190 is formed on the first layer structure 110. For example, the conductive contact 190 is formed on the first conductive contact 114 of the first layer structure 110.

Figures 8G, 8H:
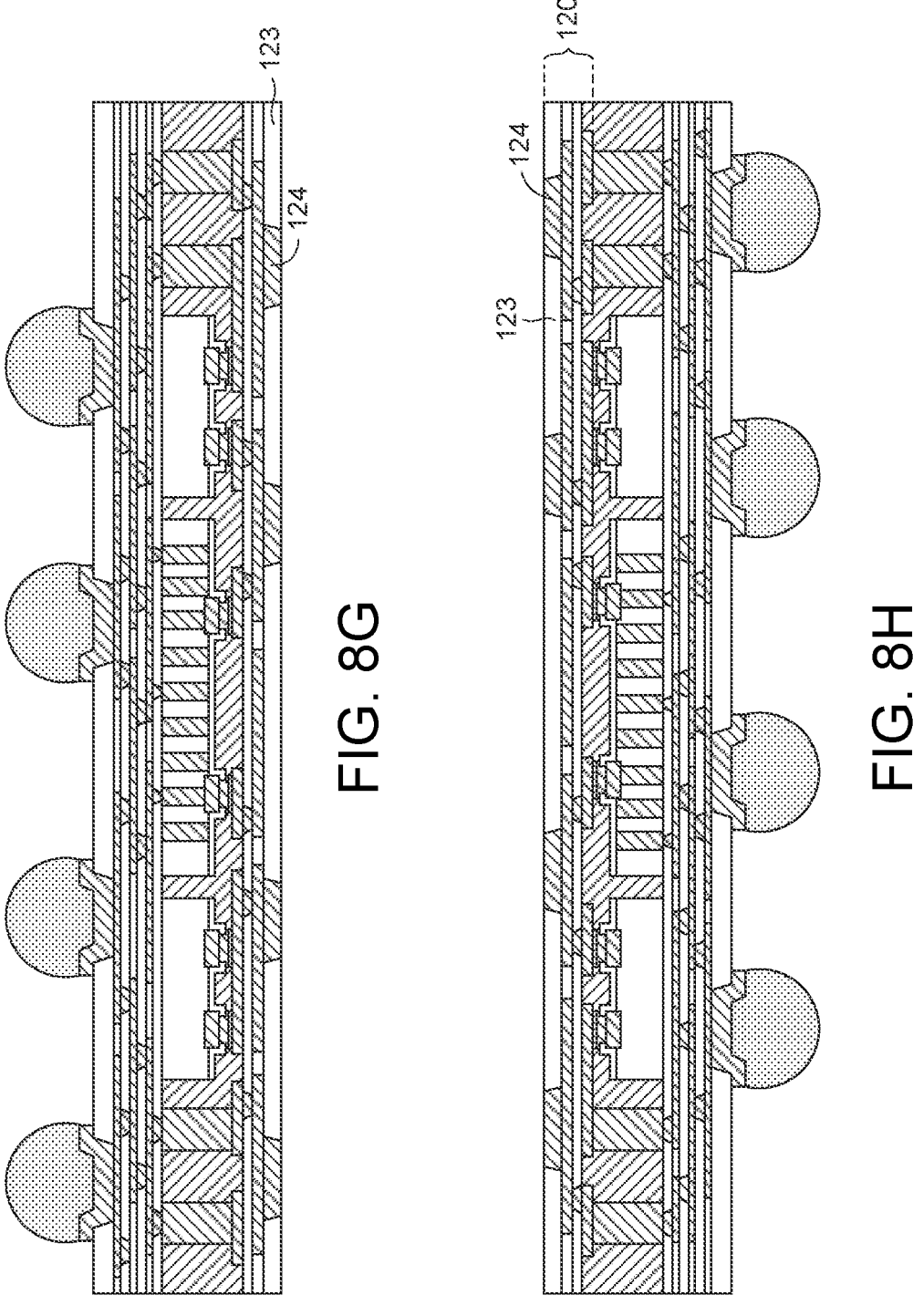

As illustrated in FIG. 8G, the first carrier 10 with the first release layer 20 of FIG. 8F are removed to expose the second dielectric layer 123 and the second conductive contact 124.

As illustrated in FIG. 8H, the structure of FIG. 8G is inverted to make the second dielectric layer 123 and the second conductive contact 124 face up.

Figure 8I:
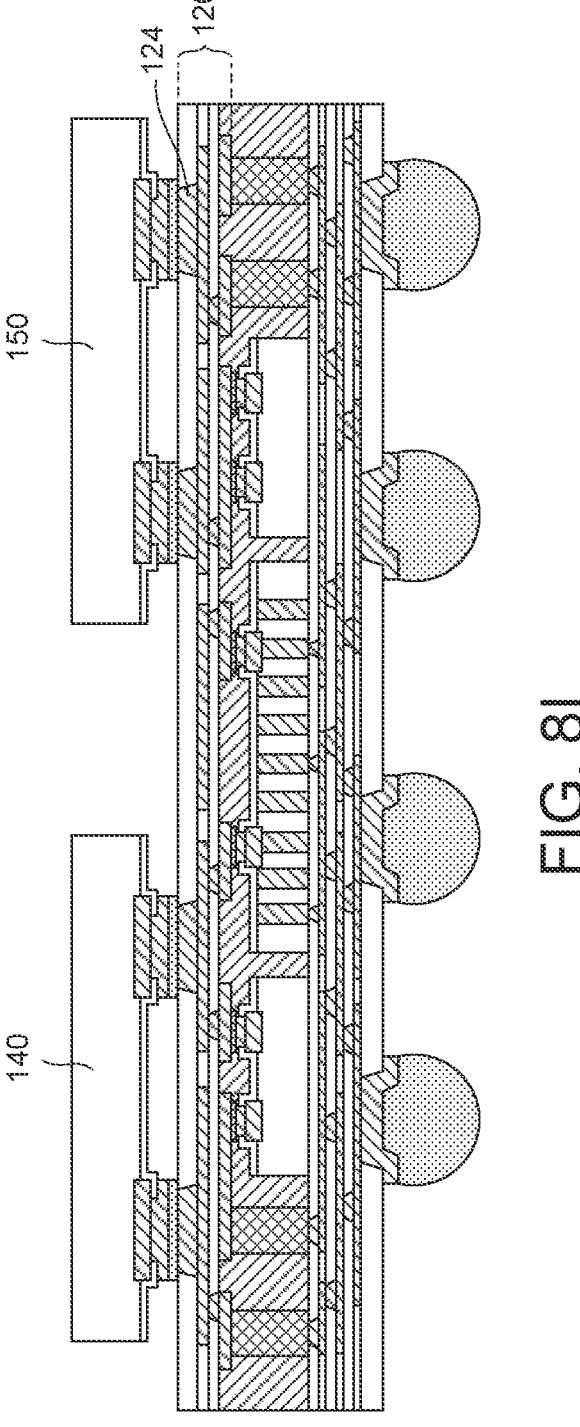

As illustrated in FIG. 8I, at least one first SoC 140 and at least one second SoC 150 are disposed on the second layer structure 120 by using, for example, a SMT. The first SoC 140 and the second SoC 150 are electrically connected to the second conductive contact 124 of the second layer structure 120.

Then, the under-filler 155 of FIG. 1B is formed between the first SoC 140 of FIG. 8I and the second layer structure 120 of FIG. 8I to encapsulate the contacts between the first SoC 140 of FIG. 8I and the second layer structure 120 of FIG. 8I, and another under-filler 155 of FIG. 1B is formed between the second SoC 150 of FIG. 8I and the second layer structure 120 of FIG. 8I to encapsulate the contacts between the second SoC 150 of FIG. 8I and the second layer structure 120 of FIG. 8I. So far, the semiconductor device 100 is completed.

The semiconductor device 200 may be formed by using the manufacturing method the same as or similar to that of the semiconductor device 100, and the similarities will not be repeated here.

Referring to FIGS. 9A to 9I, FIGS. 9A to 9I illustrate schematic diagrams of a manufacturing method of the semiconductor device 300 of FIG. 3.

Figures 9A, 9B:
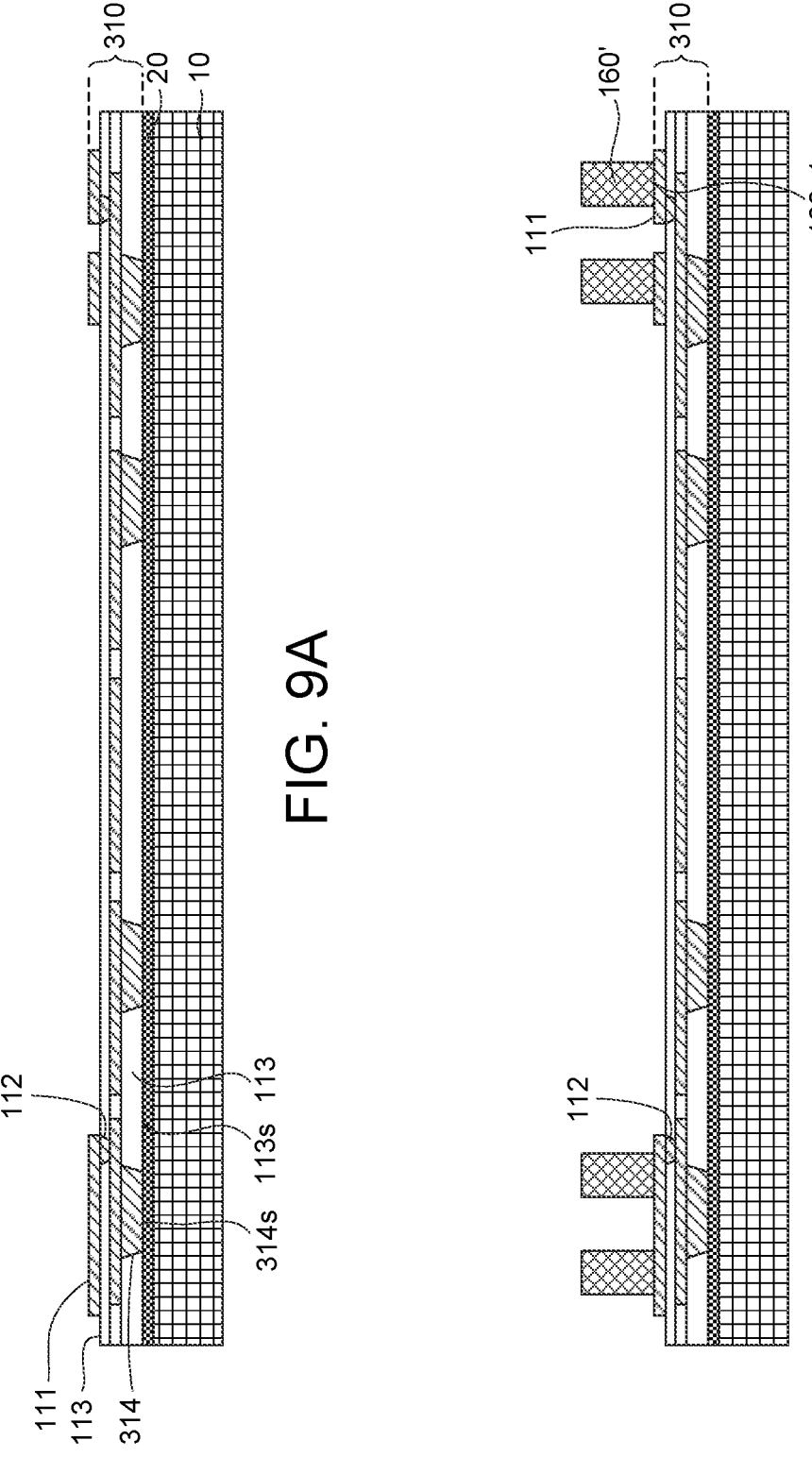
FIGS. 9A to 9I illustrate schematic diagrams of a manufacturing method of the semiconductor device of FIG. 3.

As illustrated in FIG. 9A, the first layer structure 310 (the first one) is formed on the first carrier 10 through the first release layer 20. The first layer structure 310 includes at least one first conductive trace layer 111, at least one first conductive via layer 112, at least one first dielectric layer 113 and at least first conductive contact 314, wherein the adjacent two first conductive trace layers 111 are separated from one of the first dielectric layers 113, and the adjacent two first conductive trace layers 111 may be electrically connected by one of the first conductive via layers 112. The first conductive contact 314 is electrically to the first conductive trace layer 111 or the first conductive via layer 112 of the first layer structure 310. The first conductive contact 314 has the surface 314s, and the outermost first dielectric layer 113 has the surface 113s, wherein the surface 314s and the surface 113s are flush with each other. In addition, the first conductive trace layer 111, the first conductive via layers 112 and the first conductive contact 314 may be formed by using, for example, electroplating, etc., and the first dielectric layer 113 may be formed by using, for example, lithography, etc.

As illustrated in FIG. 9B, at least one conductive pillar 160' is formed on the first layer structure 310 by using, for example, electroplating, etc. Furthermore, the conductive pillar 160' has the first surface 160s1, and the first surface 160s1 is formed on and electrically connected to the first conductive trace layer 111 or the first conductive via layer 112 of the first layer structure 310.

Figure 9C:
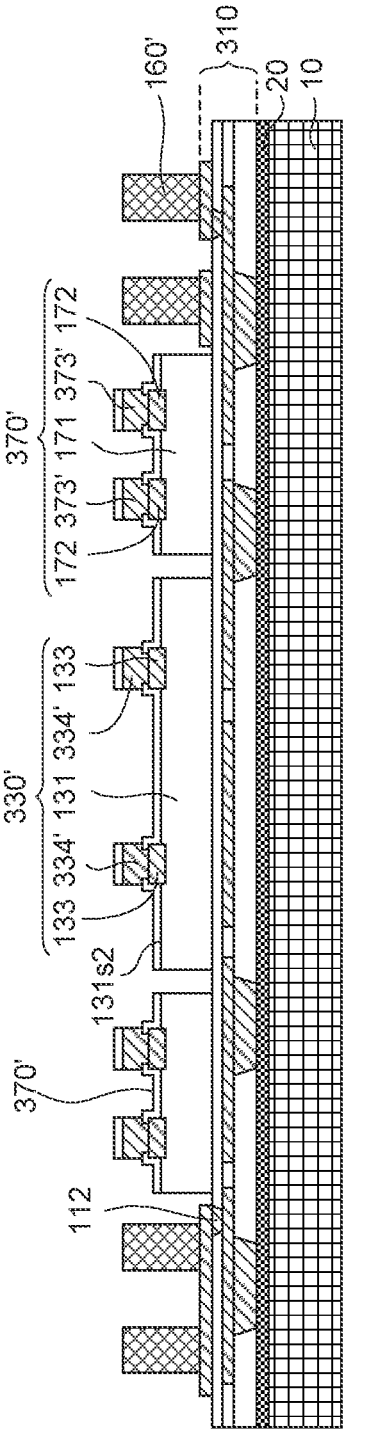

As illustrated in FIG. 9C, at least one bridge die 330' and at least one passive component 370' are disposed on the first layer structure 310 by using, for example, a SMT.

The passive component 370 includes the substrate 171, at least one conductive contact 172 and at least one conductive contact 373', wherein the conductive contacts 373' is electrically connected to the conductive contact 172 and protrudes with respect to the conductive contact 172. The bridge die 330' includes the silicon-based substrate 131, a plurality of the conductive contacts 133 and a plurality of conductive contacts 334'. The conductive contact 334' is formed on and electrically connected to the conductive contact 133, and protrudes with respect to the conductive contact 133.

Figure 9D:
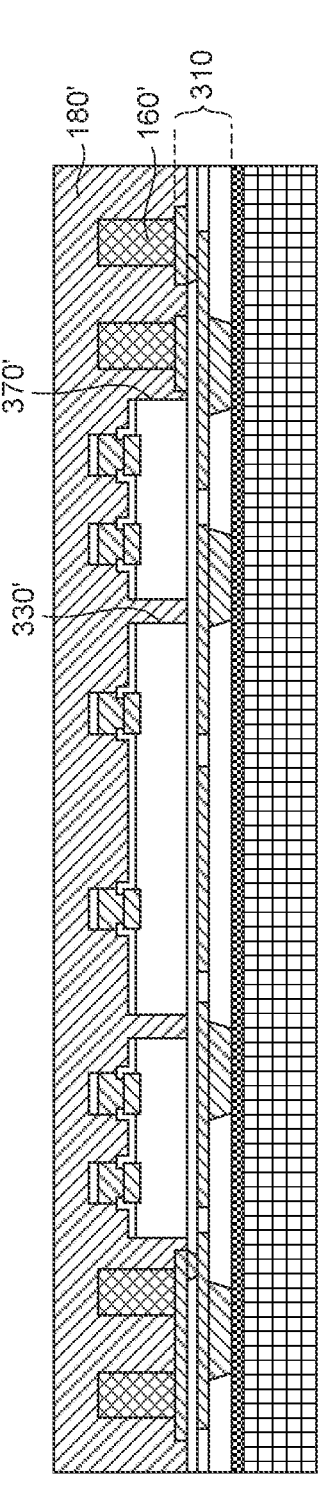

As illustrated in FIG. 9D, the first encapsulation body material 180' encapsulating at least one bridge die 330', at least one passive component 370', at least one conductive pillar 160' is formed on the first layer structure 310 by using, for example, a compression molding, an injection molding or a transfer molding.

Figures 9E, 9F:
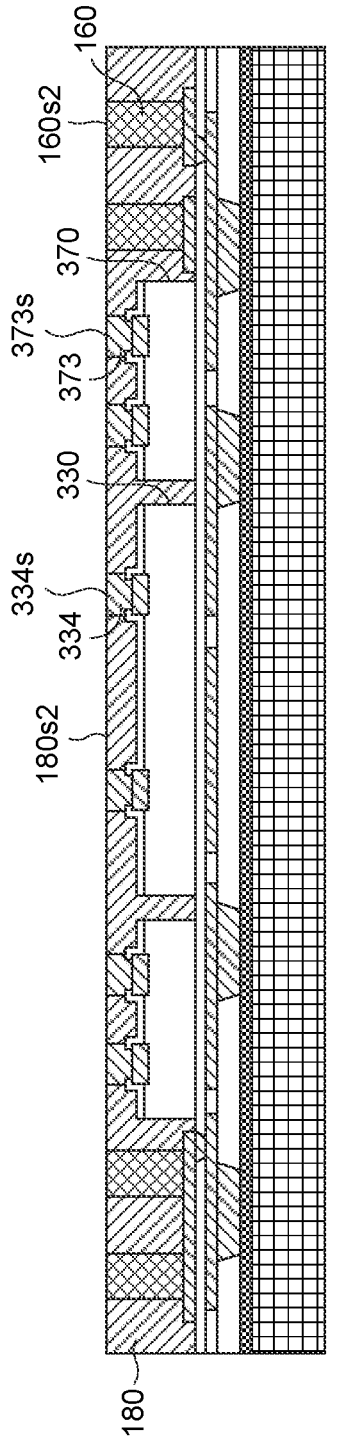

As illustrated in FIG. 9E, a portion of the first encapsulation body material 180', a portion of the bridge die 330', a portion of the passive component 370' and a portion of the conductive pillar 160' are removed to form the first encapsulation body 180, the bridge die 330, the passive component 370 and the conductive pillar 160 respectively by using, for example, a CMP. After being removed, a coplanar surface including at least two of a portion of the first encapsulation body 180, a portion of the passive component 370, a portion of the conductive pillar 160 and a portion of the bridge die 330 is formed. For example, after being removed, the first encapsulation body 180 has the second surface 180s2, the conductive contact 334 of the bridge die 330 has the surface 334s, the conductive contact 373 of the passive component 370 has the surface 373s, and the conductive pillar 160 has the second surface 160s2, wherein the surface 373s of the passive component 370, the surface 334s of the bridge die 330, the second surface 160s2 of the conductive pillar 160 and the second surface 180s2 of the first encapsulation body 180 are flush with each other.

As illustrated in FIG. 9F, the second layer structure 120 (the second one) is formed on the bridge die 330, the conductive pillar 160, the first encapsulation body 180 and the passive component 370.

Figure 9G:
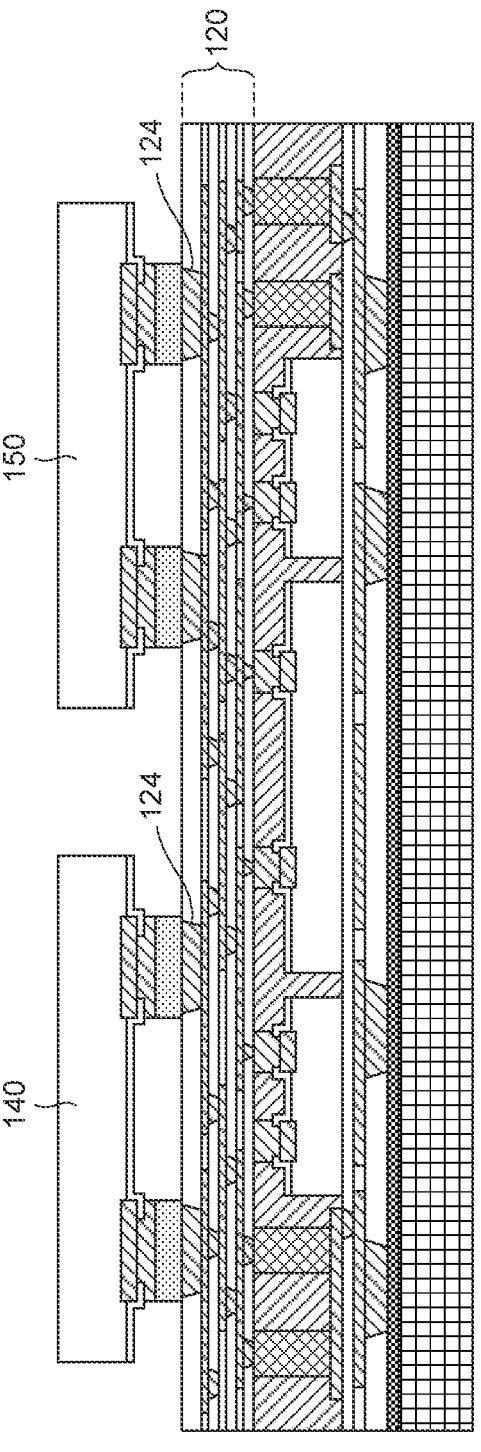

As illustrated in FIG. 9G, at least one first SoC 140 and at least one second SoC 150 are disposed on the second layer structure 120 by using, for example, a SMT. The first SoC 140 and the second SoC 150 are electrically connected to the second conductive contact 124 of the second layer structure 120.

Figures 9H, 9I:
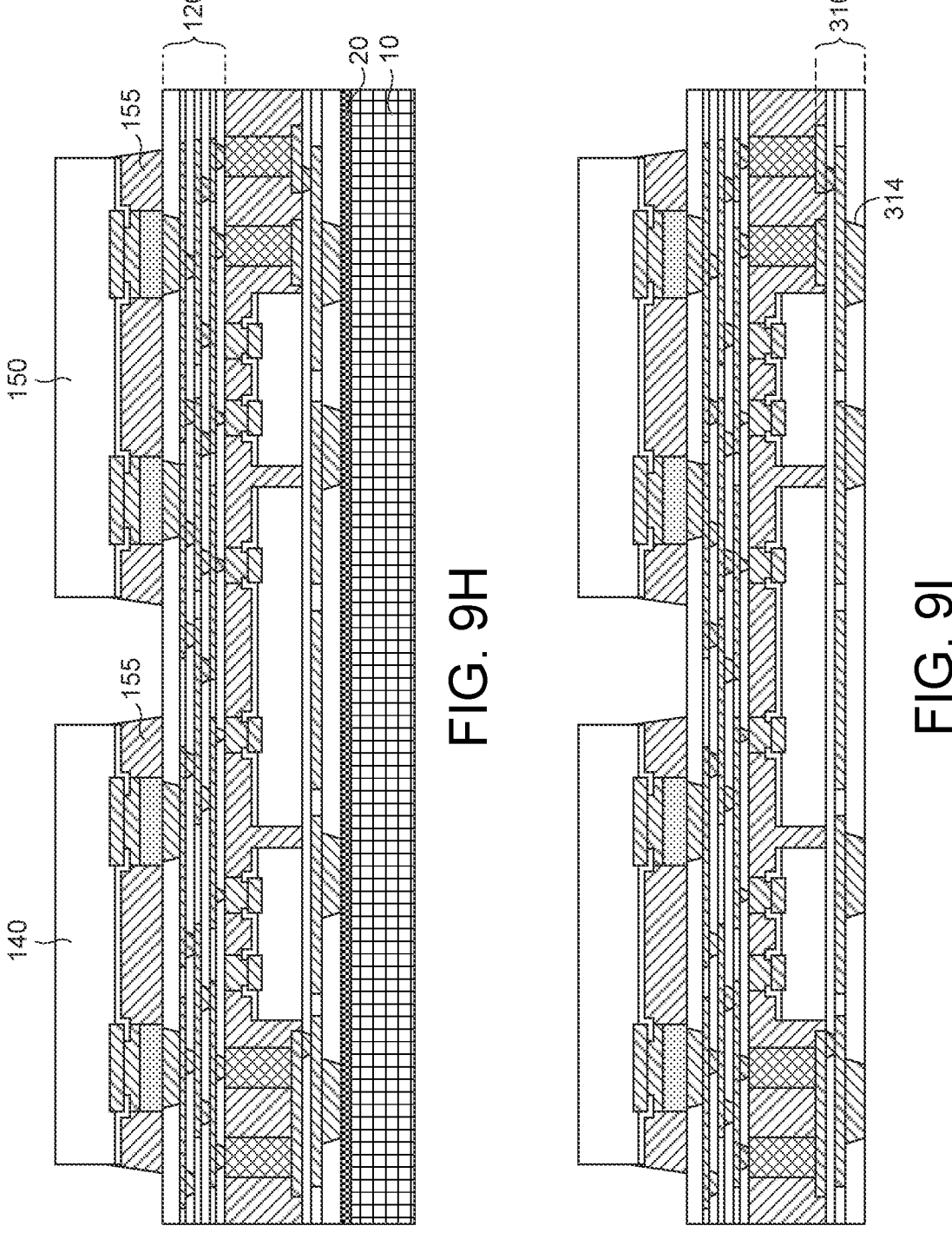

As illustrated in FIG. 9H, the under-filler 155 is formed between the first SoC 140 and the second layer structure 120 to encapsulate the contacts between the first SoC 140 and the second layer structure 120, and another under-filler 155 is formed between the second SoC 150 and the second layer structure 120 to encapsulate the contacts between the second SoC 150 and the second layer structure 120.

As illustrated in FIG. 9I, the first carrier 10 with the first release layer of FIG. 9H are removed to expose the conductive contact 314 of the first layer structure 310.

Then, at least one conductive contact 190 is formed on the first layer structure 310. For example, the conductive contact 190 is formed on the exposed first conductive contact 314 of the first layer structure 310. So far, the semiconductor device 300 is completed.

The semiconductor device 400 may be formed by using the manufacturing method the same as or similar to that of the semiconductor device 300, and the similarities will not be repeated here.

Referring to FIGS. 10A to 10H, FIGS. 10A to 10H illustrate schematic diagrams of a manufacturing method of the semiconductor device 500 of FIG. 5.

Figures 10A, 10B:
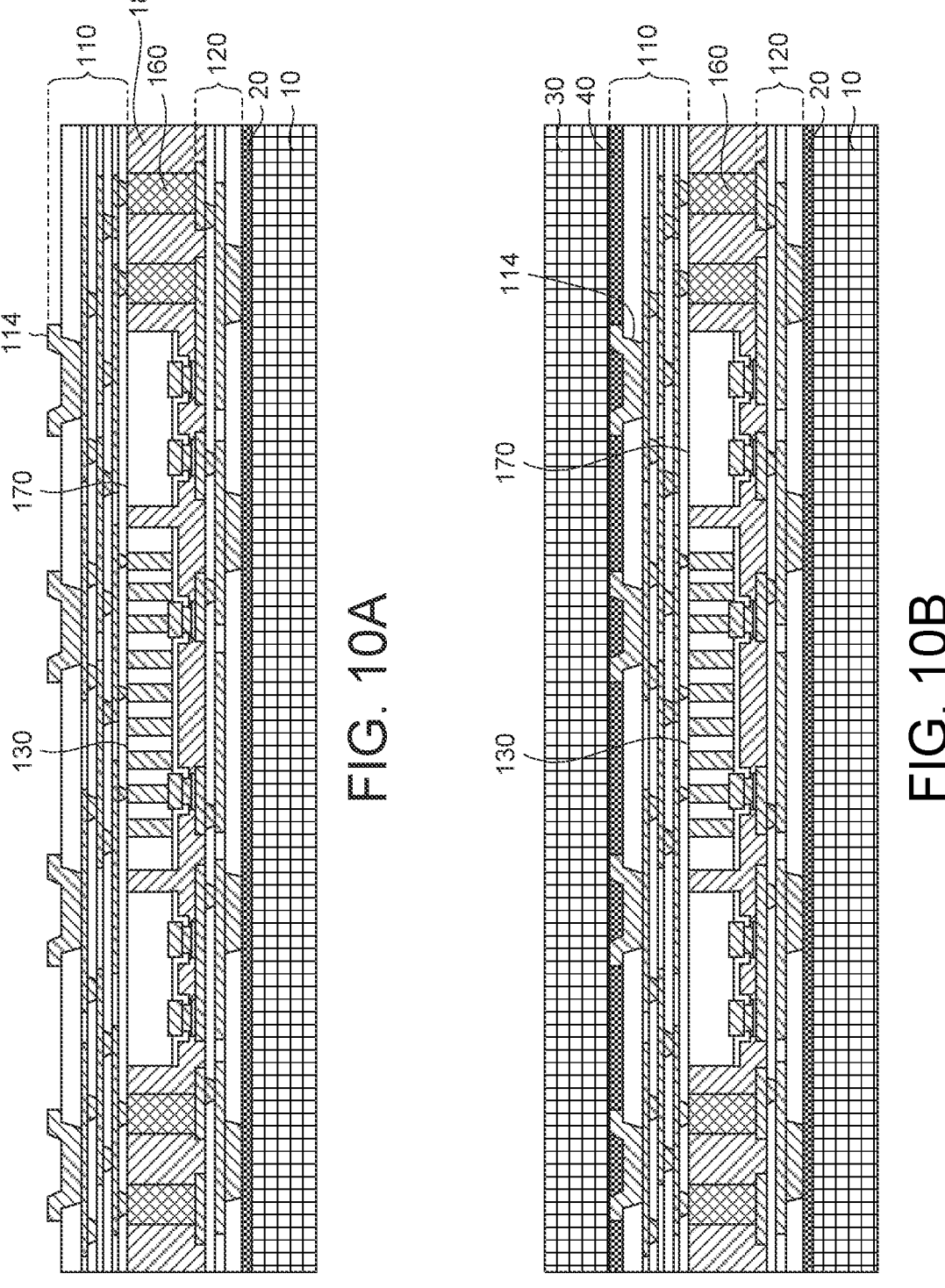
FIGS. 10A to 10H illustrate schematic diagrams of a manufacturing method of the semiconductor device of FIG. 5.

As illustrated in FIG. 10A, the structure of FIG. 8E is formed, and then the first layer structure 110 is formed on at least one bridge die 130, at least one conductive pillar 160, at least one passive component 170 and the first encapsulation body 180.

As illustrated in FIG. 10B, a second carrier 30 is disposed on the first layer structure 110 through a second release layer 40, wherein a protrusion of the first conductive contact 114 of the first layer structure 110 is embedded in the release layer 40.

Figures 10C, 10D:
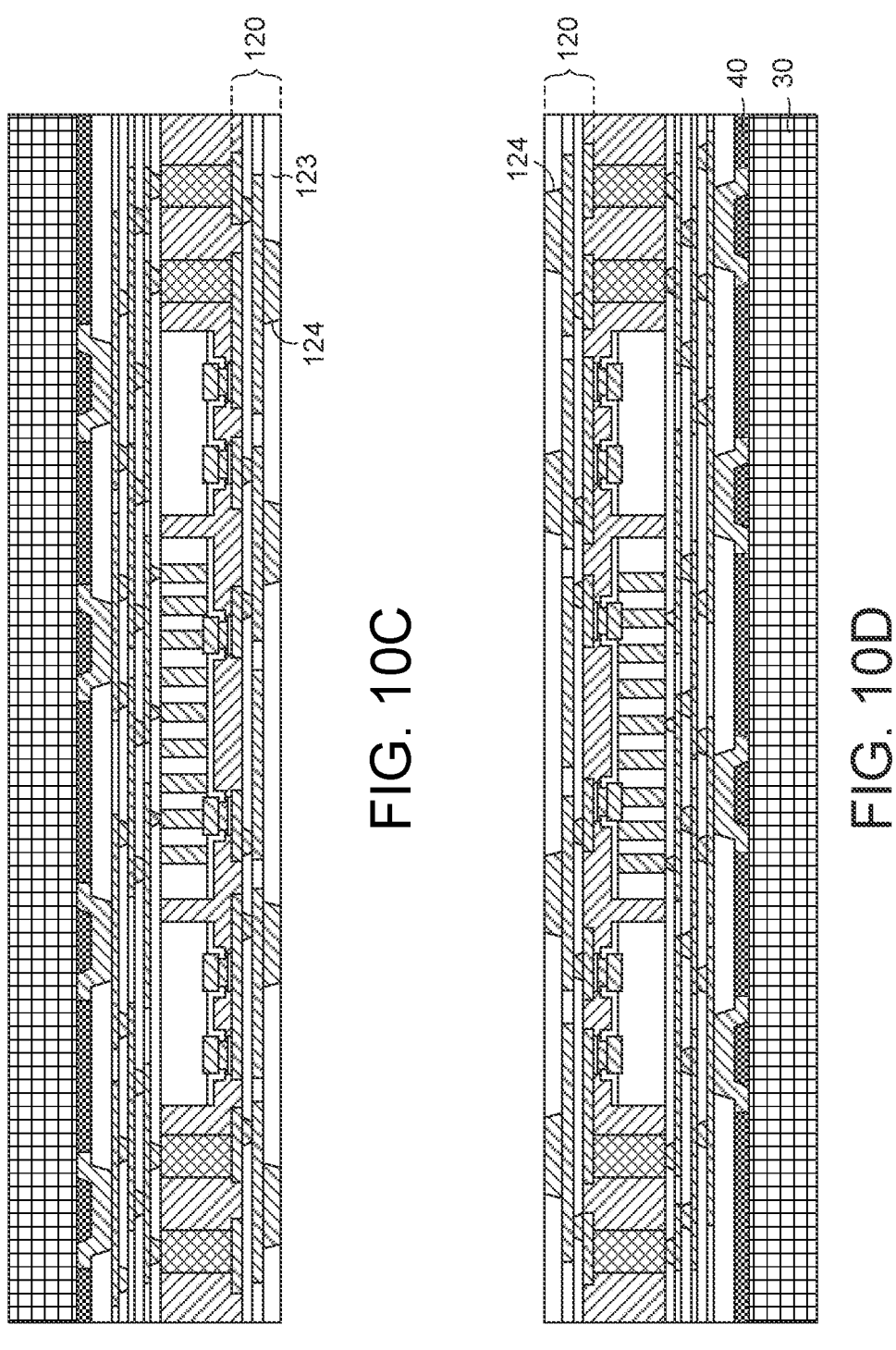

As illustrated in FIG. 10C, the second carrier 10 with the second release layer 20 of FIG. 10B are removed to expose the second dielectric layer 123 and the second conductive contact 124.

As illustrated in FIG. 10D, the structure of FIG. 10C is inverted to make the second conductive contact 124 face up.

Figures 10E, 10F:
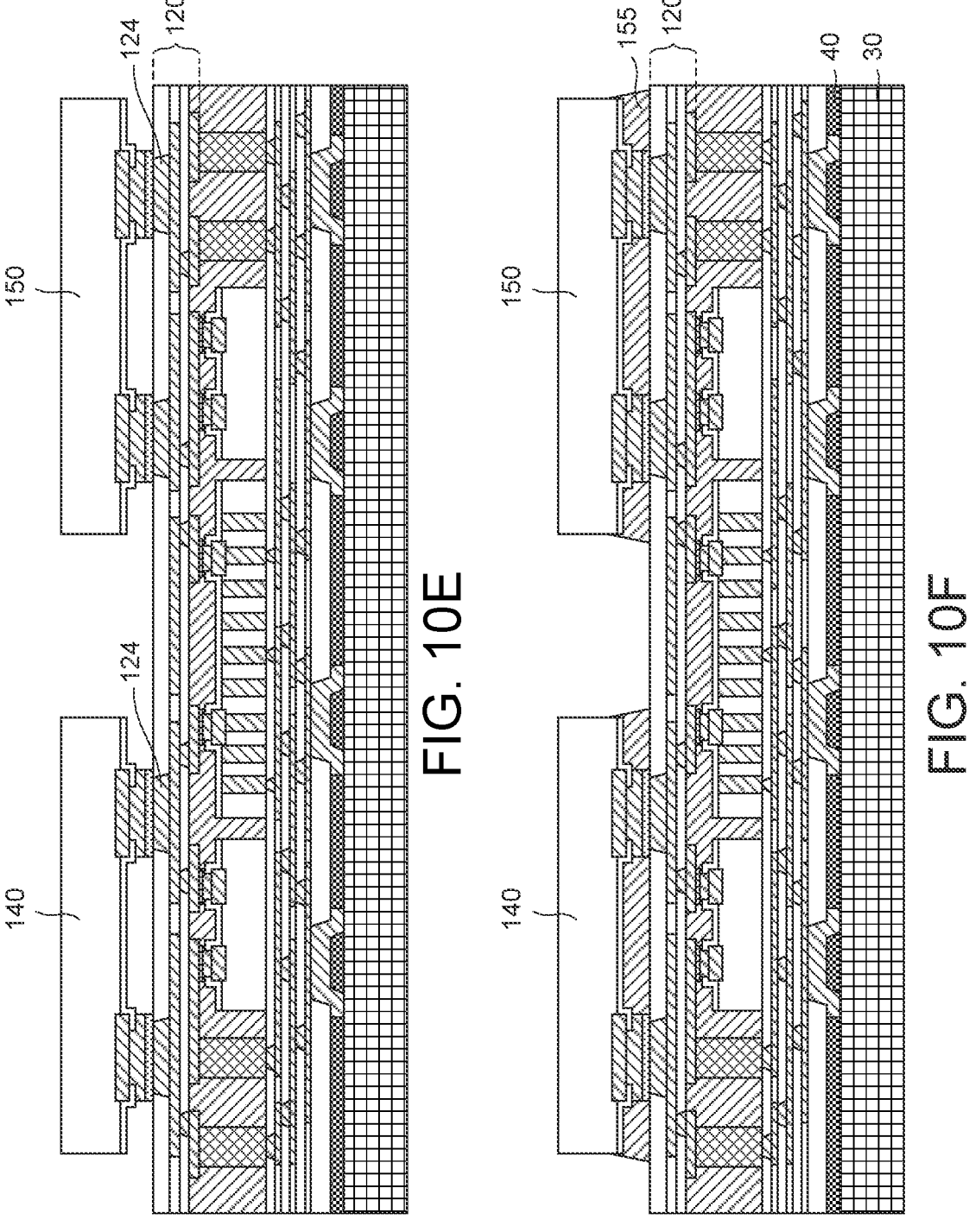

As illustrated in FIG. 10E, at least one first SoC 140 and at least one second SoC 150 are disposed on the second layer structure 120 by using, for example, a SMT. The first SoC 140 and the second SoC 150 are electrically connected to the second conductive contact 124 of the second layer structure 120.

As illustrated in FIG. 10F, the under-filler 155 is formed between the first SoC 140 and the second layer structure 120 to encapsulate the contacts between the first SoC 140 and the second layer structure 120, and another under-filler 155 is formed between the second SoC 150 and the second layer structure 120 to encapsulate the contacts between the second SoC 150 and the second layer structure 120.

Figure 10G:
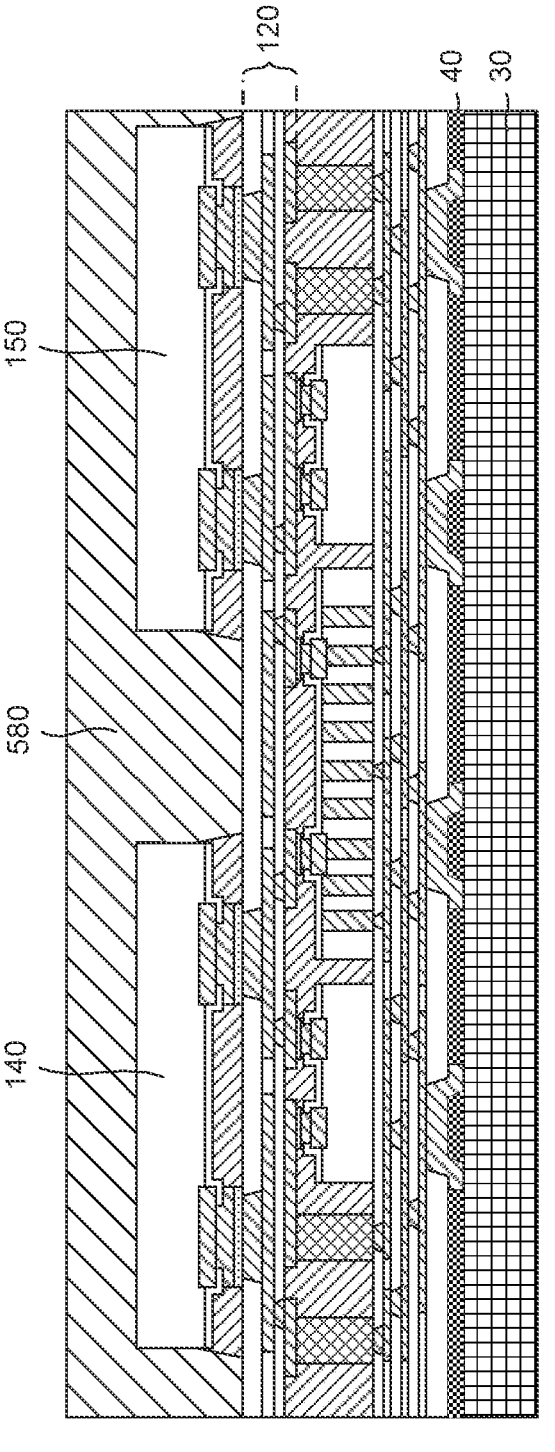

As illustrated in FIG. 10G, the second encapsulation body 580 encapsulating the first SoC 140 and the second SoC 150 is formed on the second layer structure 120.

Figure 10H:
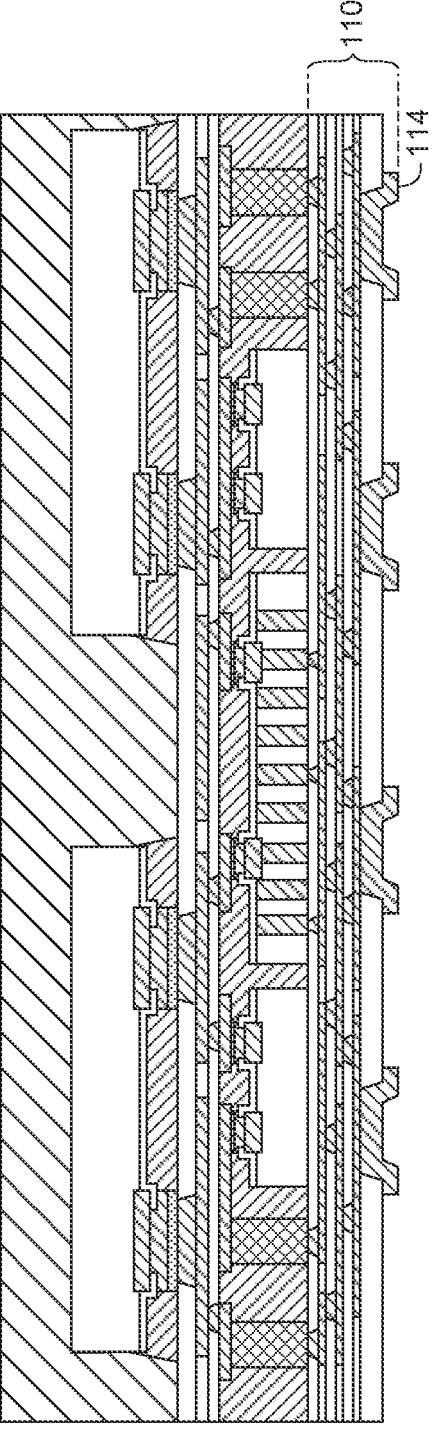

As illustrated in FIG. 10H, the second carrier 30 with the second release layer 40 of FIG. 10G are removed to expose the first conductive contact 114 of the first layer structure 110.

Then, at least one conductive contact 190 is formed on the first layer structure 110 of FIG. 10H. For example, the conductive contact 190 is formed on the first conductive contact 114 of the first layer structure 110 of FIG. 10H. So far, the semiconductor device 500 of FIG. 5 is completed.

The semiconductor device 600 may be formed by using the manufacturing method the same as or similar to that of the semiconductor device 500, and the similarities will not be repeated here.

The semiconductor device 700 may be formed by using the manufacturing method the same as or similar to that of the semiconductor device 100, and the similarities will not be repeated here.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor device, comprising:
a first layer structure;
a second layer structure;
a bridge die disposed between the first layer structure and the second layer structure;
a first System on a Chip (SoC) disposed on the second layer structure; and
a second SoC disposed on the second layer structure;
wherein the first SoC and the second SoC are electrically connected through the bridge die;
wherein the bridge die comprises a silicon-based substrate and a conductive via, and the conductive via penetrates the silicon-based substrate and electrically connects the first layer structure with the second layer structure.

2. The semiconductor device as claimed in claim 1, further comprises:
a first encapsulation body encapsulating the bridge die.

3. The semiconductor device as claimed in claim 1, further comprises:
a second encapsulation body encapsulating the first SoC and the second SoC.

4. The semiconductor device as claimed in claim 1, wherein the bridge die comprises a plurality of through-silicon vias formed within the silicon-based substrate, and the through-silicon vias electrically connect the first SoC with the second SoC.

5. The semiconductor device as claimed in claim 1, wherein the bridge die comprises a plurality of conductive contacts, and the conductive contacts are formed on a same side of the silicon-based substrate and electrically connect the first SoC with the second SoC.

6. The semiconductor device as claimed in claim 1, further comprises:
a memory die disposed on the second layer structure;
wherein the first SoC, the second SoC and the memory die are electrically connected to each other through the bridge die.

7. The semiconductor device as claimed in claim 1, further comprises:
a passive component disposed between the first layer structure and the second layer structure;
wherein the passive component and the bridge die are disposed side by side.

8. The semiconductor device as claimed in claim 1, wherein at least one of the first layer structure and the second layer structure comprises a re-distributed layer (RDL) structure.

9. The semiconductor device as claimed in claim 1, further comprises:
a conductive pillar connecting the first layer structure with the second layer structure.

10. The semiconductor device as claimed in claim 9, wherein the semiconductor device has a coplanar surface disposed on the first layer structure and comprises a portion of the conductive pillar and a portion of the bridge die.

11. The semiconductor device as claimed in claim 9, wherein the semiconductor device has a coplanar surface disposed on the second layer structure and comprises a portion of the conductive pillar and a portion of the bridge die.

12. A manufacturing method of a semiconductor device, comprising:
forming a first one of a first layer structure and a second layer structure on a first carrier;
disposing a bridge die on the first one;

forming a second one of a first layer structure and a second layer structure on the bridge die, wherein the bridge die is disposed between the first layer structure and the second layer structure; and
disposing a first SoC and a second SoC on the second layer structure, wherein the first SoC and the second SoC are electrically connected through the bridge die;
wherein the bridge die comprises a silicon-based substrate and a conductive via, and the conductive via penetrates the silicon-based substrate and electrically connects the first layer structure with the second layer structure.

13. The manufacturing method as claimed in claim 12, further comprises:
disposed a passive component on the first one;
wherein the passive component and the bridge die are disposed side by side.

14. The manufacturing method as claimed in claim 13, further comprises:
a portion of the passive component and a portion of the bridge die is removed to form a coplanar surface;
wherein the passive component and the bridge die are disposed side by side.

15. The manufacturing method as claimed in claim 12, wherein the bridge die comprises a plurality of through-silicon vias formed within the silicon-based substrate, and the manufacturing method further comprises:
forming a first encapsulation body material to encapsulate the bridge die; and
a portion of the first encapsulation body material and a portion of the bridge die is removed to form a coplanar surface.

16. The manufacturing method as claimed in claim 12, further comprising:
forming a second encapsulation body to encapsulate the first SoC and the second SoC.

17. The manufacturing method as claimed in claim 12, further comprising:
in forming the first one of the first layer structure and the second layer structure on the first carrier, the first one is the second layer structure;
before disposing the first SoC and the second SoC on the second layer structure, inverting the second layer structure, the bridge die and the first carrier to make the second layer structure face up.

18. The manufacturing method as claimed in claim 12, further comprising:
in forming the first one of the first layer structure and the second layer structure on the first carrier, the first one is the first layer structure; and
in forming the second one of the first layer structure and the second layer structure on the bridge die, the second one is the second layer structure.

19. The manufacturing method as claimed in claim 12, further comprises:
forming a conductive pillar on the first one; and
a portion of the conductive pillar and a portion of the bridge die is removed to form a coplanar surface.

20. The manufacturing method as claimed in claim 12, further comprises:
disposing a second carrier on the second one;
removing the first carrier from the first one to expose the first one; and
before disposing the first SoC and the second SoC on the second layer structure, inverting the first one, the second carrier and the bridge die to make the first one face up.

* * * * *